United States Patent
Yanagisawa et al.

(10) Patent No.: US 6,360,687 B1
(45) Date of Patent: *Mar. 26, 2002

(54) WAFER FLATTENING SYSTEM

(75) Inventors: Michihiko Yanagisawa; Takeshi Sadohara, both of Ayase; Chikai Tanaka, Kanagawa-Ken; Shinya Iida, Ayase; Yasuhiro Horiike, 2-12, Higashifushimi 3-Chome, Houya-shi, Tokyo, all of (JP)

(73) Assignees: SpeedFam-IPEC Co., Ltd, Ayase; Yasuhiro Horiike, Houya, both of (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/412,185

(22) Filed: Oct. 4, 1999

(30) Foreign Application Priority Data

Nov. 26, 1998 (JP) .............................. 10-336272
Mar. 1, 1999 (JP) .............................. 11-052993

(51) Int. Cl.⁷ .............................. C23C 16/511
(52) U.S. Cl. .............................. 118/723 MW; 118/719; 118/730; 118/729; 118/695; 118/696; 216/84; 216/85; 216/88
(58) Field of Search .............................. 430/318; 118/724, 118/715, 723 ME, 725, 697; 438/720, 240, 33, 381, 396, 424, 455, 464, 541, 642, 682, 691, 692, 700, 723, 740, 783; 134/1.1, 256; 156/241, 345; 216/59, 60; 428/447

(56) References Cited

U.S. PATENT DOCUMENTS 6,080,529 A * 6/2000 Ye et al. ..................... 430/318
6,153,530 A * 6/2000 Ye et al. ..................... 438/720
6,086,679 A * 7/2000 Lee et al. .................... 118/724

FOREIGN PATENT DOCUMENTS

| JP | 8-330202 | 12/1996 |
| JP | 9-115887 | 5/1997 |
| JP | 9-283590 | 10/1997 |
| JP | 9-312279 | 12/1997 |

* cited by examiner

Primary Examiner—Gregory Mills
Assistant Examiner—Rudy Zervigon
(74) Attorney, Agent, or Firm—Burr & Brown

(57) ABSTRACT

A wafer flattening system is provided to consecutively and automatically remove the natural oxide film from a wafer and flatten and smooth the wafer so as to improve the surface roughness of the wafer and improve the work efficiency. A step of immersing the wafer in an aqueous solution of hydrofluoric acid of a natural oxide film removing device is performed so as to remove the natural oxide film, then followed by a step of locally etching the surface of the wafer at a local etching apparatus by an activated species gas produced from $SF_6$ gas to flatten the surface. Then, a step of giving a mirror finish to the wafer surface by a CMP apparatus is performed to smooth it. It is also possible to perform the step of removal of the natural oxide film by spraying the entire surface of the wafer by an activated species gas produced from a mixed gas of $CF_4$ gas and $H_2$ gas and possible to perform the step of smoothing by spraying the entire surface of the wafer by an activated species gas produced from a mixed gas of $CF_4$ gas and $O_2$ gas.

16 Claims, 20 Drawing Sheets

WAFER FLATTENING SYSTEM

BACKGROUND OF THE INVENTION

1. Field of the Invention

The present invention relates to a wafer flattening system for locally etching projections on a wafer surface by an activated species gas to flatten the surface or locally etching relatively thick portions of a wafer to achieve a uniform distribution of thickness of the wafer.

2. Description of the Related Art

FIG. 25 is a schematic sectional view of an example of a wafer flattening technique of the related art.

In FIG. 25, reference numeral 100 is a plasma generator. Activated species gas G in the plasma generated by the plasma generator 100 is sprayed on the surface of a wafer W from a nozzle 101.

The wafer W is placed and secured on a stage 120. The stage 120 is made to move in the horizontal direction to guide a portion Wa relatively thicker than a prescribed thickness on the surface of the silicon wafer W (hereinafter referred to as a "relatively thick portion") directly under the nozzle 101.

The activated species gas G is then sprayed from the nozzle 101 to the projecting relatively thick portion Wa to locally etch the relatively thick portion Wa to achieve a uniform distribution of thickness of the surface of the wafer W and thereby flatten the surface of the wafer W.

The above wafer flattening technique of the related art, however, suffered from the following problem.

The ions in the plasma generated by the plasma generator 100 are accelerated by the potential difference applied between the plasma and wafer W in striking the wafer W. Only the portions struck by the ions are etched by large extent. Further, due to sputtering, the atoms of the surface of the wafer W are stripped away. Therefore, the surface of the wafer W becomes rough at the atomic order.

Further, particles floating around the wafer W and particles generated in the discharge tube forming the nozzle 101 deposit on the surface of the wafer W causing the etchability of the portions where the particles are deposited to decline. As a result, the amounts of etching at the portions where the particles are deposited and the portions where they are not deposited differ and the surface of the wafer W is again roughened.

Due to the above, when local etching is performed, the root mean square roughness (RMS) of the surface of the wafer W ends up becoming larger. When the surface of the wafer W was actually observed after local etching under an interatomic microscope, it was learned that when a wafer W having an RMS before local etching of less than 1 nm is locally etched by the above wafer flattening process, the RMS ends up deteriorating to as bad as about 10 nm.

Further, when transferring the wafer W from a previous step to the local etching step, an oxide film naturally forms on the surface of the wafer W. If the wafer is locally etched in a state with this natural oxide film left alone, white turbidity will form at the surface of the wafer W after the local etching and will cause a deterioration of the surface roughness of the wafer W.

SUMMARY OF THE INVENTION

The present invention was made to solve the above problems and has as its object to provide a wafer flattening system configured to continuously and automatically perform the removal of the natural oxide film of a wafer and the flattening and smoothing of the wafer so as to improve the surface roughness of the wafer and to increase the work efficiency.

To achieve the above object, according to the aspect of the invention, there is provided a wafer flattening system comprising: a natural oxide film removing device for removing a natural oxide film formed on a wafer surface; a first transport device for taking out a wafer from which the natural oxide film has been removed by the natural oxide film removing device and transporting it to a predetermined location; a local etching apparatus provided with a discharge tube with a nozzle facing the wafer transported by the first transport device and a plasma generator for causing plasma discharge of a gas of a fluorine compound or a mixed gas including a fluorine compound fed to the discharge tube so as to produce a predetermined activated species gas and spraying the activated species gas from the nozzle of the discharge tube to a relatively thick portion of the surface of the wafer to locally etch the relatively thick portion; a second transport device for taking out a wafer flattened by the local etching apparatus and transporting it to a predetermined location; and a smoothing apparatus for grinding off a projection on the surface of the wafer transported by the second transport device to smooth the wafer surface.

Due to this configuration, the natural oxide film formed on the wafer surface is removed by the natural oxide film removing device, then the wafer is transported by the first transport device to the local etching apparatus. Further, at the local etching apparatus, the plasma generator causes plasma discharge of the gas of the fluorine compound or the mixed gas including the fluorine compound fed into the discharge tube so as to produce the activated species gas. This being done, the activated species gas is sprayed from the nozzle of the discharge tube to relatively thick portions of the wafer, whereby the relatively thick portion is locally etched. Therefore, by successively locally etching the entire surface of the wafer, the entire wafer surface is flattened. Further, the flattened wafer is transported by the second transport device to the smoothing apparatus. The smoothing apparatus grinds off the projections on the surface of the wafer to smooth the wafer surface.

In particular, according to an embodiment of the invention, the first transport device and the second transport device are configured by a single transport device used for both purposes.

As an example of the natural oxide film removing device, according to an embodiment of the invention, the natural oxide film removing device is provided with a solution tank for storing a solution for removal of the natural oxide film of the wafer, a washer, and a third transport device for immersing the wafer in the solution tank and then transporting it to the washer.

Due to this configuration, the wafer is immersed by the third transport device in the solution tank storing the solution for removal of the natural oxide film. After the removal of the natural oxide film, the third transport device is used to transport the wafer to the washer where the solution and other unnecessary matter are washed off.

There are various types of solutions for removal of the natural oxide film, but as preferable examples, according to an embodiment of the invention, the solution for removal of the natural oxide film stored in the solution tank is an aqueous solution of hydrofluoric acid.

As another example of the natural oxide film removing device, according to an embodiment of the invention, the natural oxide film removing device is provided with a discharge tube for spraying a predetermined activated species gas over the entire surface of the wafer and a plasma generator for causing plasma discharge of a mixed gas including a fluorine compound and hydrogen in the discharge tube so as to produce the activated species gas.

Due to this configuration, the plasma generator causes plasma discharge of the mixed gas containing the fluorine compound and hydrogen in the discharge tube and the production of the activated species gas. This being done, the activated species gas is sprayed from the discharge tube over the entire surface of the wafer, whereby the natural oxide film on the wafer surface is etched by the activated species gas.

Note that as a preferable example of the ratio of mixture of the mixed gas, according to an embodiment of the invention, the ratio of the hydrogen to the fluorine compound in the mixed gas is from 0.1% to 50% by volume.

Further, it is preferable to position a flat or notch serving as a mark for identification of the crystallization direction of the wafer or wafer position at the time of the local etching processing. Therefore, according to an embodiment of the invention, the natural oxide film removing device is provided with a positioning mechanism for positioning a flat or notch of the wafer.

As an example of a smoothing apparatus, according to an embodiment of the invention, the smoothing apparatus is a chemical mechanical polishing apparatus provided with a platen having a polishing pad on its surface and being capable of rotating, a carrier for holding the surface of the wafer in a state facing the platen and rotating while pressing the wafer against the polishing pad of the platen, and a polishing slurry feeder for feeding a predetermined polishing slurry between the wafer surface and the polishing pad.

The activated species gas G2 produced by this plasma discharge is sprayed from the nozzle 61a of the alumina discharge tube 61 and diffuses over the entire surface of the silicon wafer W. Due to this, the surface of the silicon wafer W is etched by the F radicals or O radicals contained in the activated species gas G2. That is, when the activated species gas G2 is sprayed on to the surface of the silicon wafer W, as shown in FIG. 16, due to the presence of O radicals, a reaction product R thought to be $SiO_xF_y$ (x, y=1, 2 . . . ) is produced. Further, the F radicals etch the surface of the silicon wafer W. Further, the reaction product R is produced on the entire surface of the silicon wafer W, but due to the vapor pressure, the majority of the reaction product R evaporates, while the reaction product R is deposited in the slight depressions Wc causing roughness to remain without evaporating. Therefore, the reaction product R deposits in the depressions Wc to protect the depressions from etching by the F radicals, while only the portions other than the depressions Wc are etched by the F radicals.

Due to this configuration, the wafer is held by the carrier in a state with its surface facing the platen side and the wafer is pressed against the polishing pad of the rotating platen while rotating. Further, the polishing slurry feeder feeds the polishing slurry between the wafer surface and the polishing pad, whereby the wafer surface is smoothed to a mirror finish surface.

As another example of a smoothing apparatus, according to an embodiment of the invention, the smoothing apparatus is provided with a discharge tube for spraying a predetermined activated species gas over the entire surface of the wafer and a plasma generator for causing plasma discharge of a mixed gas of a fluorine compound and oxygen in the discharge tube to produce the activated species gas.

Due to this configuration, the plasma generator causes plasma discharge of the mixed gas containing the fluorine compound and oxygen in the discharge tube and the production of the activated species gas. This being done, the activated species gas is sprayed from the discharge tube over the entire surface of the wafer, whereby the entire surface of the wafer is etched and smoothed by the activated species gas.

Further, there are various types of fluorine compounds. As examples, according to an embodiment of the invention, the fluorine compound in the mixed gas is selected from the group consisting of carbon tetrafluoride, sulfur hexafluoride, and nitrogen trifluoride.

Further, as a preferable example of the ratio of mixture of the mixed gas, according to an embodiment of the invention, the ratio of the oxygen to the carbon tetrafluoride in the mixed gas is 200% to 400% by volume.

Further, it is possible to provide a plurality of local etching apparatuses. Therefore, according to an embodiment of the invention, there is provided a wafer flattening system further comprising: N (an integer of 2 or more) number of local etching apparatuses; and a controlling apparatus provided with a natural oxide film removing device controller for controlling the first transport device to load an unprocessed wafer to a not operating natural oxide film removing device, making the natural oxide film removing device operate for exactly a time enabling natural oxide film removal, then controlling the first transport device to transport the wafer finished being removed of the natural oxide film from the natural oxide film removing device to a not operating X-th (integer from 2 to N) local etching apparatus, a local etching apparatus controller for making the X-th local etching apparatus operate for exactly a time enabling local etching, then controlling the second transport device to transport the wafer finished being locally etched from the local etching apparatus to the not operating smoothing apparatus, and a smoothing apparatus controller for making the smoothing apparatus operate for exactly a time enabling smoothing, then controlling the second transport device to unload the wafer finished being smoothed from the smoothing apparatus.

Due to this configuration, the first transport device loads the unprocessed wafer to a not operating natural oxide film removing device under the control of the natural oxide film removing device controller of the controlling apparatus. Further, the natural oxide film removing device is operated for exactly the time enabling natural oxide film removal under the control of the natural oxide film removing device controller, then the first transport device is made to transport the wafer finished being removed of the natural oxide film from the natural oxide film removing device to a not operating X-th local etching apparatus. Further, the X-th local etching apparatus is operated for exactly the time enabling local etching under the control of the local etching apparatus controller, then the second transport device is made to transport the wafer finished being locally etched from the local etching apparatus to the not operating smoothing apparatus. Suitably thereafter the wafer smoothed at the smoothing apparatus is unloaded under the control of the smoothing apparatus controller. That is, a plurality of wafers after processing for natural oxide film removal are transported to a plurality of not operating local etching apparatuses. The plurality of local etching apparatuses enable the plurality of wafers to be locally etched at one time. Further, the wafers are transported to the smoothing apparatus in order starting from the first wafer finished being locally etched.

In particular, according to an embodiment of the invention, a transport sequence controller for controlling the natural oxide film removing device controller is provided at the controlling apparatus so that the first transport device transports a wafer finished being removed of the natural oxide film to the local etching apparatus with the longest non-operating time among the local etching apparatuses finishing local etching processing.

Due to this configuration, when transporting a wafer finished being removed of the natural oxide film to a not operating local etching apparatus, if there are a plurality of not operating local etching apparatuses, the wafer is transported to the local etching apparatus with the longest non-operating time after stopping operation.

Further, according to an embodiment of the invention, N>m is set when the time enabling local etching in a local etching apparatus is m (positive integer) times the time enabling natural oxide film removal in the natural oxide film removing device.

Further, if it were possible to have the natural oxide film removing step, the local etching step, and the smoothing step performed by a single apparatus, it would be possible to save the time for transport of the wafers to the different steps and possible to make the processing work further efficient. Therefore, according to an aspect of the invention, there is provided a wafer flattening system comprising: an etching apparatus provided with a discharge tube with a nozzle facing a surface of a wafer and a plasma generator for causing plasma generation of a predetermined gas fed to the discharge tube so as to produce a predetermined activated species gas and spraying the activated species gas from the nozzle of the discharge tube to the surface of the wafer to etch the wafer surface; a gas feeder capable of feeding a gas into the discharge tube; a transfer mechanism for shortening or increasing the distance between the nozzle of the discharge tube and the wafer; and a first automatic controller provided with a natural oxide film removing processing controller for controlling the transfer mechanism to increase the distance between the nozzle and the wafer until the activated species gas sprayed from the nozzle will diffuse over the entire surface of the wafer and controlling the gas feeder to feed a mixed gas containing a fluorine compound and hydrogen to the inside of the discharge tube, then driving the etching apparatus, a local etching processing controller for controlling the transfer mechanism to shorten the distance between the nozzle and the wafer until the activated species gas sprayed from the nozzle will locally strike a relatively thick portion of the wafer and controlling the gas feeder to make it feed a gas of a fluorine compound or a mixed gas including a fluorine compound into the discharge tube, then driving the etching apparatus, and a smoothing processing controller for controlling the transfer mechanism to increase the distance between the nozzle and the wafer until the activated species gas sprayed from the nozzle will diffuse over the entire surface of the wafer and controlling the gas feeder to make it feed a mixed gas containing a fluorine compound and oxygen to the inside of the discharge tube, then driving the etching apparatus.

Further, according to an embodiment of the invention, there is provided a wafer flattening system further comprising: N (an integer of 2 or more) number of etching apparatuses; a loader for loading a wafer into the etching apparatus; an unloader for unloading a wafer from the etching apparatus; and a second controller for driving the loader to make it load N number of unprocessed wafers inside the N number of etching apparatuses, then driving the first automatic controller and then, after the elapse of a predetermined time, driving the unloader to unload the N number of processed wafers from the N number of etching apparatuses.

BRIEF DESCRIPTION OF THE DRAWINGS

The above and other objects, features, and advantages of the present invention will become more readily apparent from the following description of presently preferred embodiments of the invention taken in conjunction with the accompanying drawings, in which.

DESCRIPTION OF THE PREFERRED EMBODIMENTS

Below, preferred embodiments of the present invention will be explained with reference to the drawings.

(First Embodiment)

Figure 1:
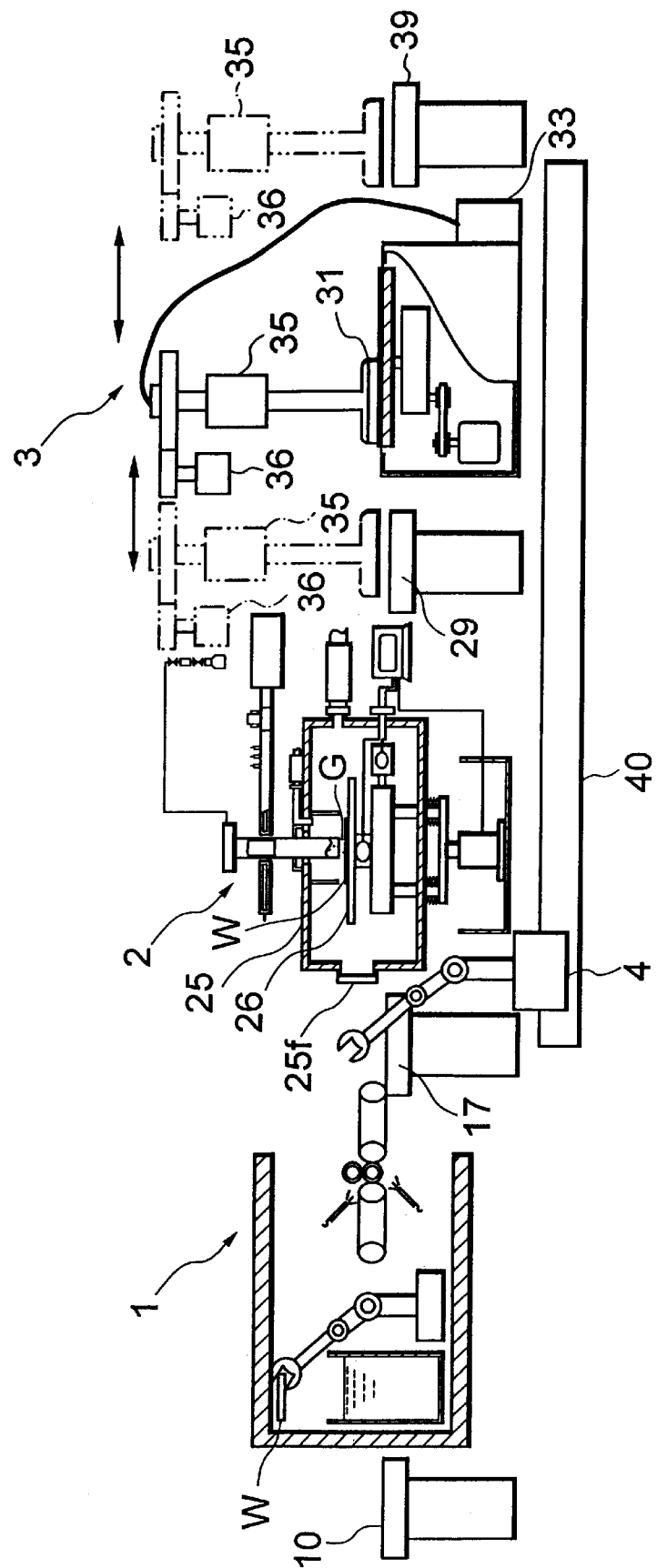
FIG. 1 is a schematic view of the configuration of a wafer flattening system according to a first embodiment of the present invention.

FIG. 1 is a schematic view of the configuration of a wafer flattening system according to a first embodiment of the present invention.

The wafer flattening system is provided with a local oxide film removing device 1, a local etching apparatus 2, a smoothing apparatus 3, and a transfer robot 4 serving as the first and second transport devices.

Figure 2:
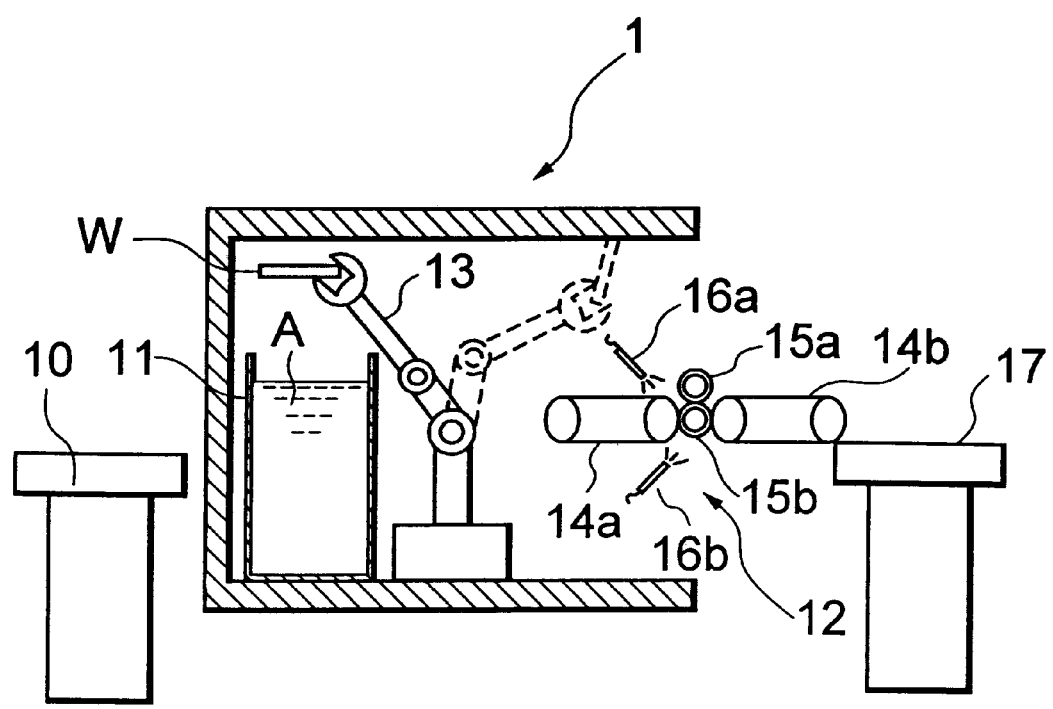
FIG. 2 is a view of the structure of a natural oxide film removing device.

The natural oxide film removing device 1 is a device for removing the natural oxide film formed on the surface of the silicon wafer W. FIG. 2 is a view of the structure of the natural oxide film removing device 1.

As shown in FIG. 2, the natural oxide film removing device 1 is provided with a solution tank 11, a washer 12, and a robot 13 serving as a third transport device.

The solution tank 11 stores an aqueous solution A of hydrofluoric acid for removing the natural oxide film formed on the surface of the silicon wafer W (hereinafter referred to as the "solution A").

The washer 12 is a device for washing off the solution adhered to the silicon wafer W taken out from the solution tank 11 and is comprised of belt conveyors 14a, 14b for feeding the silicon wafer W to a table 17, a pair of sponge brushes 15a, 15b arranged between the belt conveyors 14a, 14b, and a pair of nozzles 16a, 16b for spraying pure water.

The robot 13 is a device for holding a silicon wafer W placed on the table 10 through the previous step, immersing it in the solution A of the solution tank 11 for a predetermined time, then placing it on the belt conveyor 14a of the washer 12.

Due to this, the silicon wafer W finished being processed at the previous step is immersed in the solution tank 11 by the robot 13 and removed of its natural oxide film by the solution A. Suitably thereafter, it is placed on the belt conveyor 14a and transported to the pair of sponge brushes 15a, 15b. The two sides of the silicon wafer W are sprayed with pure water from the nozzles 16a, 16b and washed by the pair of sponge rollers 15a, 15b. Further, the silicon wafer W is fed out to the belt conveyor 14b by the rotation of the pair of sponge rollers 15a, 15b and then transported on the table 17 by the belt conveyor 14b.

Figure 3:
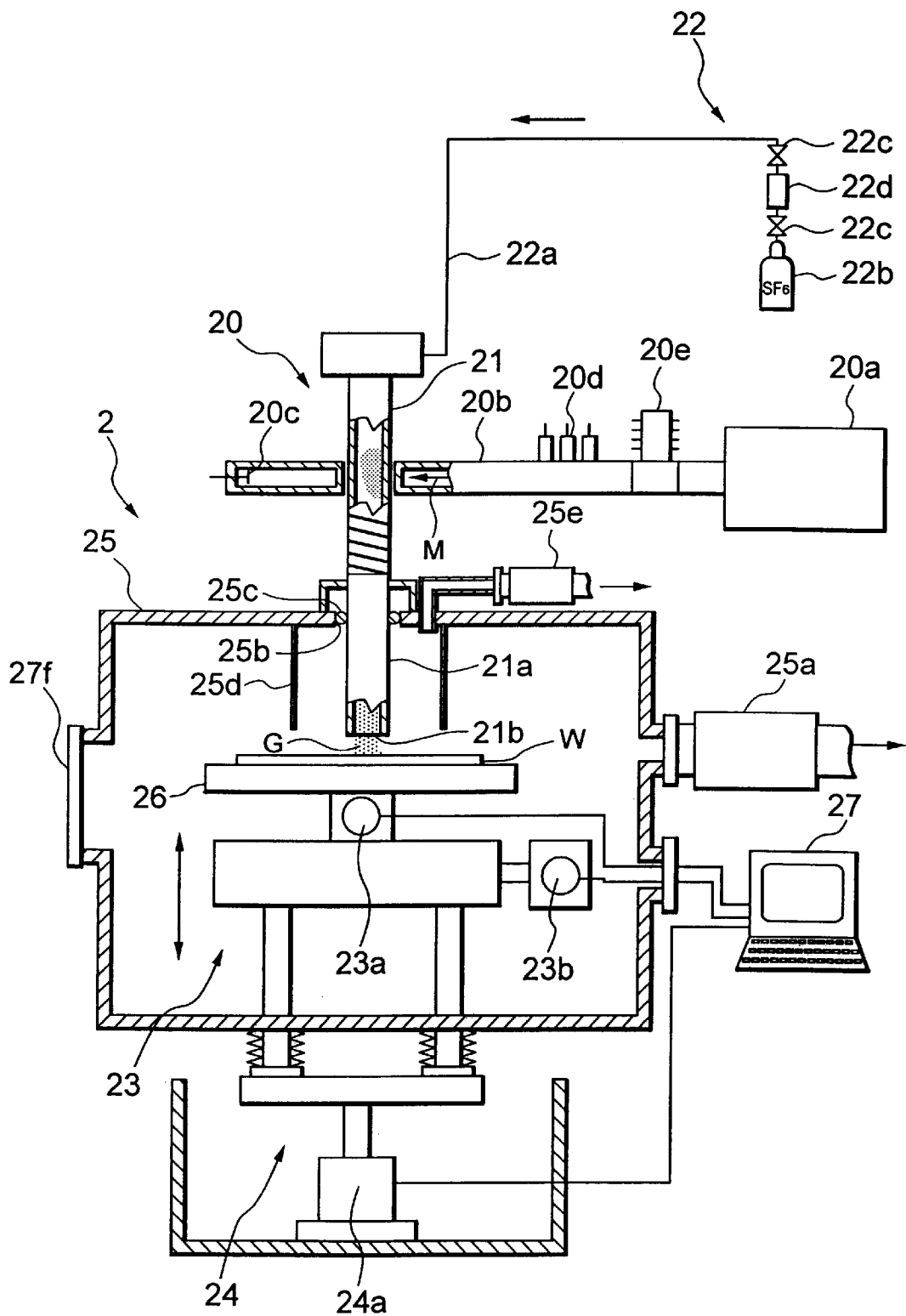
FIG. 3 is a partially sectional schematic view of the structure of a local etching apparatus.

Further, the local etching apparatus 2 is a device for spraying an activated species gas G on relatively thick portions of the surface of the silicon wafer W so as to locally etch the relatively thick portions and thereby flatten the entire surface of the silicon wafer W. FIG. 3 is a partially sectional view of the structure of the local etching apparatus 2.

As shown in FIG. 3, the local etching apparatus 2 is provided with a plasma generator 20, an alumina discharge tube 21, a gas feeder 22, an X-Y drive mechanism 23, and a Z-drive mechanism 24.

The plasma generator 20 is a device for causing plasma discharge of gas inside the alumina discharge tube 21 to produce an activated species gas G and is comprised of a microwave generator 20a and a waveguide 20b.

The microwave generator 20a is a magnetron and can generate a microwave M of a predetermined frequency.

The waveguide 20b is for guiding the microwave M generated by the microwave generator 20a and is fit over the alumina discharge tube 21.

At the inside of the left end of the waveguide 20b is attached a reflection plate (short plunger) 20c for reflecting the microwave M to form a standing wave. Further, in the middle of the waveguide 20b are attached a 3-stub tuner 20d for phase alignment of the microwave M and an isolator 20e for bending the reflected microwave M heading toward the microwave generator 20a 90° in direction (surface direction of FIG. 1).

The alumina discharge tube 21 is a cylinder having a nozzle 21a at its lower end and is connected at its upper end to a feed pipe 22a of the gas feeder 22.

The gas feeder 22 is a device for feeding gas into the alumina discharge tube 21 and has a $SF_6$ (sulfur hexafluoride) gas cylinder 22b. The gas cylinder 22b is connected to the feed pipe 22a through a valve 22c and flow rate controller 22d.

By adopting this configuration for the plasma generator 20, when a gas is fed from the gas feeder 22 to the alumina discharge tube 21 and a microwave M is generated from the microwave generator 20a, plasma discharge is caused in the alumina discharge tube 21 and an activated species gas G produced by the plasma discharge is sprayed from the nozzle 21a.

A silicon wafer W is designed to be held by the electrostatic force of a chuck 26 in a chamber 25 when placed on the chuck 26. The chamber 25 is provided with a vacuum pump 25a. The vacuum pump 25a may be used to make the inside of the chamber 25 a vacuum. Further, a hole 25b is formed in the center of the top surface of the chamber 25. The nozzle 21a of the alumina discharge tube 21 is inserted through this hole 25b into the chamber 25. An O-ring 25c is attached between the hole 25b and the alumina discharge tube 21 so as to hold the space between the hole 25b and the alumina discharge tube 21 air-tight.

Further, a duct 25d is provided around the nozzle 21a inserted into the hole 25b. By driving the vacuum pump 25e, the reaction gas at the time of etching is exhausted to the outside of the chamber 25.

The X-Y drive mechanism 23 is arranged inside the chamber 25 and supports the chuck 26 from below.

The X-Y drive mechanism 23 makes the chuck 26 move in the lateral direction in FIG. 1 by an X-drive motor 23a and makes the chuck 26 and the X-drive motor 23a move together in the direction perpendicular to the surface of the paper on which FIG. 1 is drawn by a Y-drive motor 23b. That is, it is possible to make the nozzle 21a move in the X-Y direction relative to the silicon wafer W by the X-Y drive mechanism 23.

A Z-drive mechanism 24 supports the X-Y drive mechanism 23 as a whole in the chamber 25 from below. The Z-drive mechanism 24 makes the X-Y drive mechanism 23 move in the vertical direction by a Z-drive motor 24a and enables the distance between the opening 21b of the nozzle 21a and the surface of the silicon wafer W to be adjusted.

The X-drive motor 23a and Y-drive motor 23b of the X-Y drive mechanism 23 and the Z-drive motor 24a of the Z-drive mechanism 24 are controlled in drive operation by a control computer 27 based on a predetermined program.

In FIG. 1, the smoothing apparatus 3 is an apparatus for grinding off projections on the surface of the silicon wafer W to smooth the surface thereof. In this embodiment, as the smoothing apparatus, a chemical mechanical polishing apparatus (hereinafter referred to as a "CMP apparatus") is used.

Figure 4:
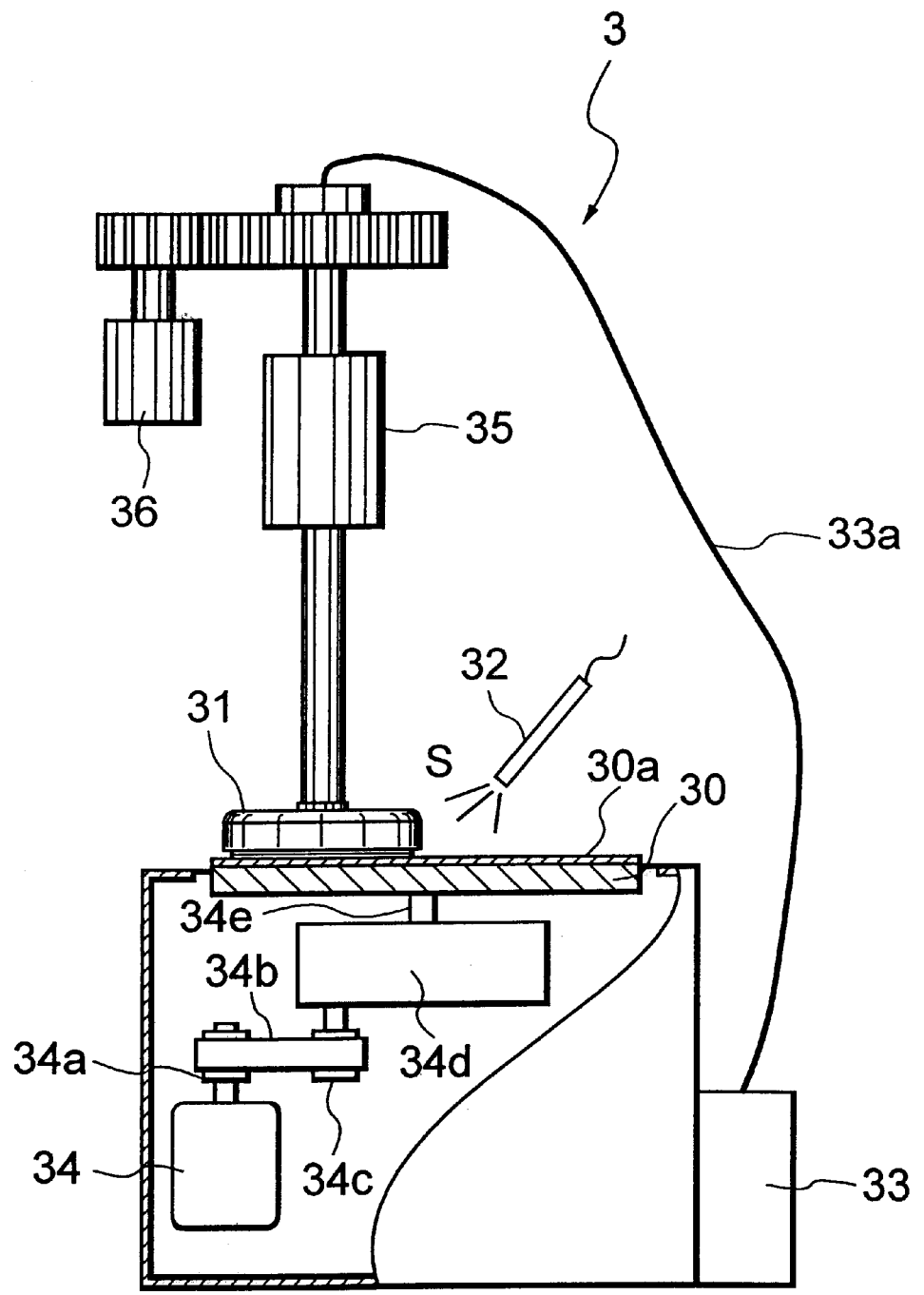
FIG. 4 is a partially sectional front view of a CMP apparatus.

FIG. 4 is a partially sectional front view of the CMP apparatus 3.

As shown in FIG. 4, the CMP apparatus 3 is provided with a platen 30 on the surface of which a polishing pad 30a is bonded, a carrier 31, a nozzle 32 serving as a polishing slurry feeder, and an air pump 33.

The platen 30 is designed to be driven to rotate by a main motor 34 inside the apparatus housing. That is, the rotation of a main motor 34 is transmitted by a pulley 34a and the rotation of the pulley 34a is transmitted through a belt 34b and a pulley 34c to a transmission 34d. The rotation is converted in speed by the transmission 34d and transmitted to the platen 30 through an output shaft 34e connected to the platen 30 thereby rotating the platen 30 at a predetermined speed.

The carrier 31 is designed to be able to rotate in a state holding a silicon wafer W while pressing the silicon wafer W against the polishing pad 30a of the platen 30.

Figure 5:
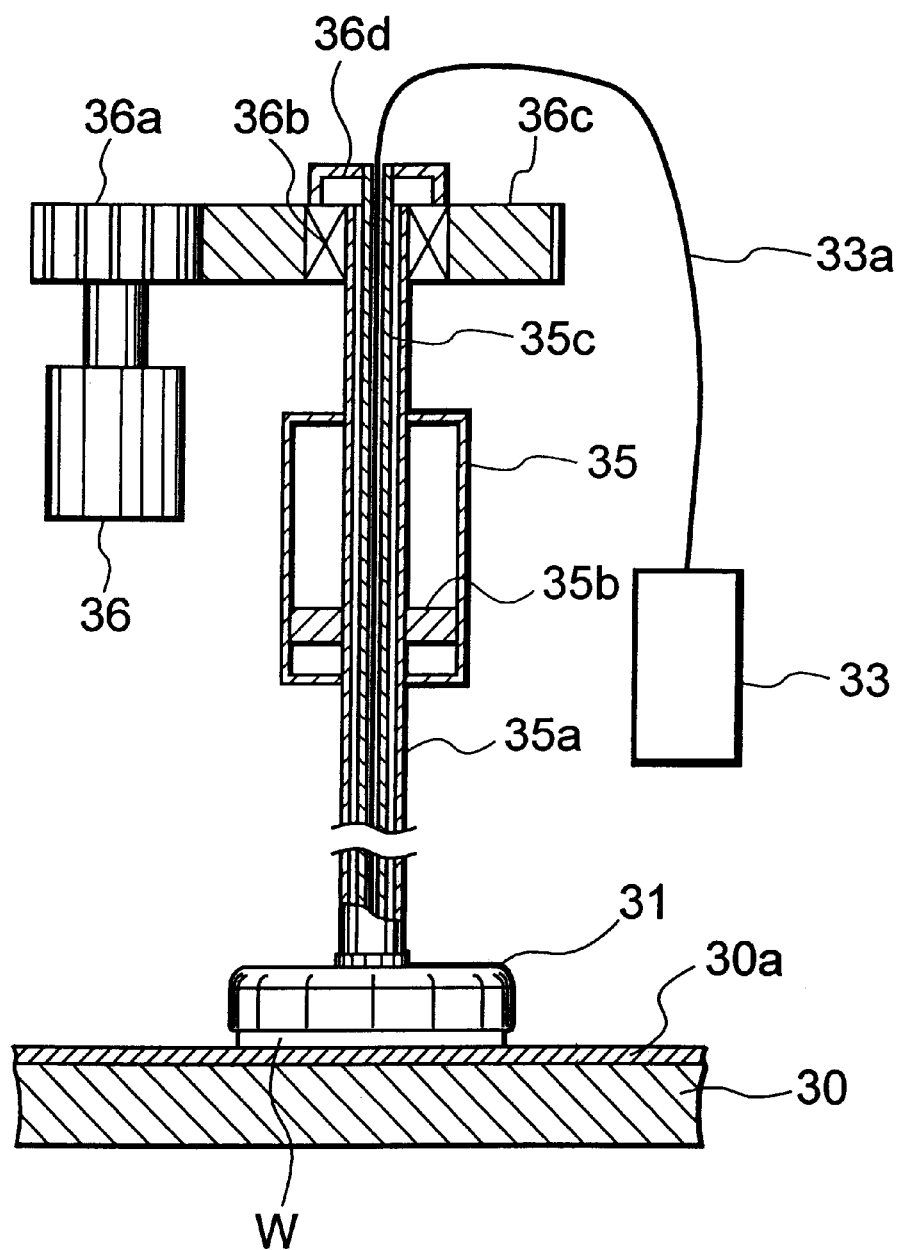
FIG. 5 is a sectional view of the mechanism for vertical movement and rotation of a carrier.

FIG. 5 is a sectional view of mechanism for making the carrier 31 move vertically and rotate.

As shown in FIG. 5, the cylinder 35 slidingly houses a piston 35b affixed to the outside of a piston rod 35a passing through the cylinder 35. By adjusting the air pressure in the cylinder 35, it is possible to make the piston rod 35a move up and down integrally with the piston 35b and adjust the pressing force on the carrier 31. Further, a gear 36c attached to the top part of the piston rod 35a through a bearing 36b is engaged with a gear 36a of a shaft of the motor 36, while the top end of an inner rod 35c is affixed to a support member 36d secured to the top surface of the gear 36c. Due to this, the rotation of the motor 36 is transmitted to the inner rod 35c through the gears 36a, 36c and the support member 36d, and the inner rod 35c rotates at a predetermined speed in the piston rod 35a.

Figure 6:
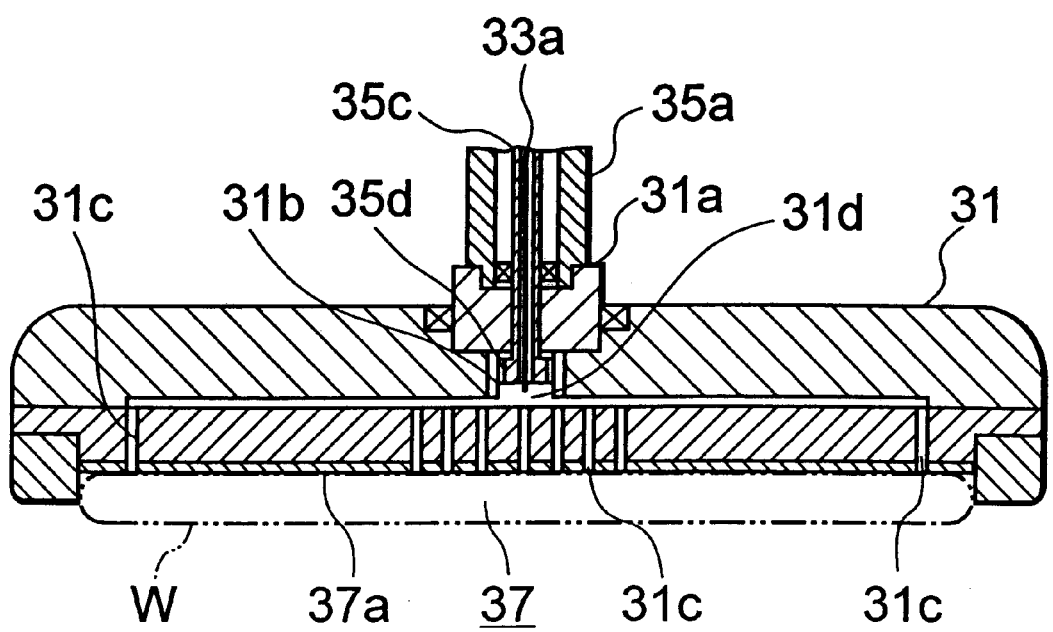
FIG. 6 is a sectional view of a carrier.

FIG. 6 is a sectional view of the carrier 31.

As shown in FIG. 6, the carrier 31 has a connecting member 31a rotatably attached to its top portion. This connecting member 31a has the lower end of the piston rod 35a linked with it. Further, an internal gear 31b of the carrier 31 and an external gear 35d of the lower end of the inner rod 35c are engaged whereby when the inner rod 35c rotates by the drive force of the motor 36, the rotation force of the motor 36 is transmitted to the carrier 31 by the engagement of the gears 31b, 35d.

Further, the carrier 31 is provided at its lower surface with a depression 37 for housing the silicon wafer W and has a backing sheet 37a bonded to its top surface. A plurality of air holes 31c formed at the depression 37 side pass air from the backing sheet 37a to an air exit/inlet 31d. Due to this, an air pump 33 draws out the air in the air holes 31c through an air hose 33a inserted in the inner rod 35c and extending to the air exit/inlet 31d so as to hold the silicon wafer W by suction.

In FIG. 4, the nozzle 32 is a device for supplying a slurry S as a polishing slurry between the silicon wafer W held by the carrier 31 and the platen 30 and is arranged above the platen 30.

Note that the assembly of the carrier 31, cylinder 35, and motor 36 assembled together as explained above is transferred by a not shown transfer mechanism between the table 29 and table 39 shown in FIG. 1.

The transfer robot 4 inserts its arm from a gate valve 25f of the local etching apparatus 2 to the inside of the chamber 25, carries out the silicon wafer W finished being locally etched from the chuck 26, moves over a rail 40 to the table 29 side, and places the silicon wafer W held on the table 29. Suitably thereafter, the transfer robot 4 moves to the table 17 side and carries a silicon wafer W on the table 17 to the inside of the chamber 25 where it places the silicon wafer W on the chuck 26.

Next, the operation of the wafer flattening system of this embodiment will be explained.

First, the natural oxide film removing step is performed.

That is, as shown in FIG. 2, a silicon wafer W finished being processed at the previous step and placed on the table 10 is held by the robot 13 and immersed in the solution tank 11 for a predetermined time. Due to this, the reaction of $n(H_2O)+2HF \rightarrow (H_2O)nH^+ + HF_2^-$ and the reaction of $SiO_2 + 4HF_2^- \rightarrow SiF_4 + 2H_2O$ are performed in the solution A, so the natural oxide film ($SiO_2$) formed on the silicon wafer W is removed by the solution A in the solution tank 11. Suitably thereafter, the silicon wafer W is taken out of the solution tank 11 and placed on the belt conveyor 14a of the washer 12 and is sent between the pair of sponge brushes 15a, 15b for washing. Further, the silicon wafer W is sent out on to the belt conveyor 14b by the rotation of the sponge brushes 15a, 15b and loaded on to the table 17 by the belt conveyor 14b.

When the silicon wafer W is placed on the table 17, the first transport step is performed. That is, the silicon wafer W on the table 17 is placed by the transfer robot 4 on to the chuck 26 in the chamber 25 of the local etching apparatus 2 and a gate valve 25f is closed.

This being done, the local etching apparatus 2 performs the local etching step.

That is, as shown in FIG. 3, the vacuum pump 25a is driven, the X-Y drive mechanism 23 as a whole is raised, and the silicon wafer W is brought close to an opening 21b of the nozzle 21a.

Further, the valve 22c of the gas feeder 22 is opened, whereupon $SF_6$ gas in the gas cylinder 22b flows out to the feed pipe 22a and is fed inside the alumina discharge tube 21.

At this time, the opening degree of the valve 22c is adjusted so that the pressure of the $SF_6$ gas is maintained at a predetermined pressure, and the flow rate of the $SF_6$ gas is adjusted by the flow rate controller 22d.

In parallel with the operation of feeding the $SF_6$ gas, the microwave generator 20a is driven, the $SF_6$ gas is made to discharge by the generated microwave M, and thereby an activated species gas G containing F (fluorine) radicals is produced. Due to this, the activated species gas G is guided to the nozzle 21a of the alumina discharge tube 21 and is sprayed from the opening 21b of the nozzle 21a to the silicon wafer W side.

In this state, the X-Y drive mechanism 23 is driven by the control computer 27, and the chuck 26 holding the silicon wafer w by suction is made to move in a zigzag in the X-Y direction.

Figure 7:
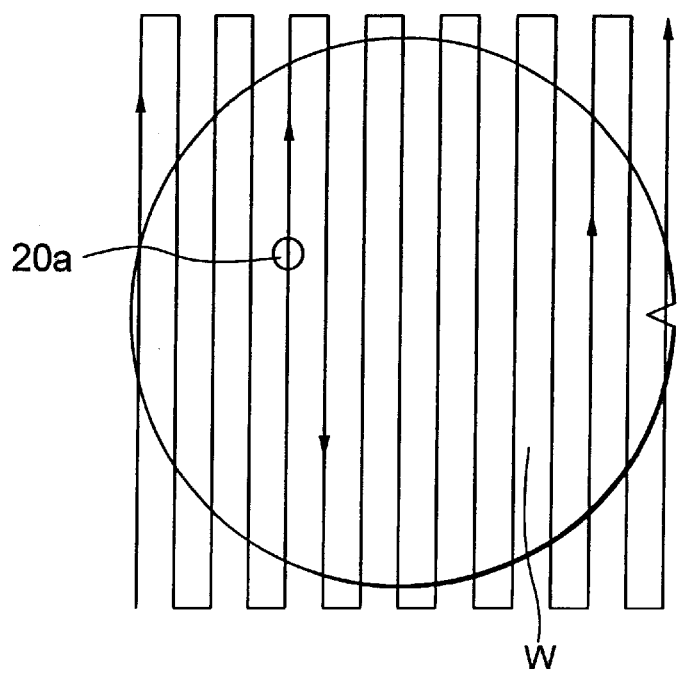
FIG. 7 is a plan view of the state of scanning of a silicon wafer by a nozzle.
Figure 8:
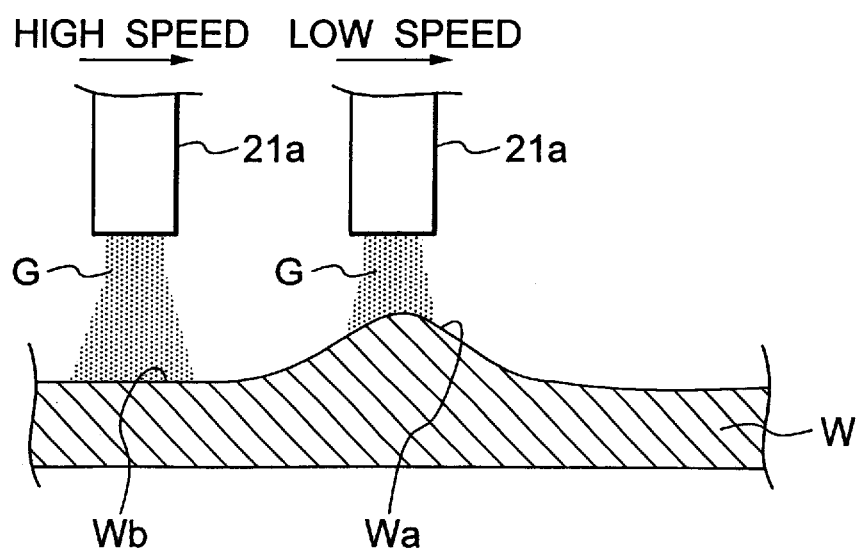
FIG. 8 is a sectional view of a local etching apparatus showing a local etching process.

That is, as shown in FIG. 7, the nozzle 21a is made to scan the silicon wafer W in a relatively zigzag manner. At this time, the relative speed of the nozzle 21a with respect to the silicon wafer W is set to be substantially inversely proportional to the thickness of the relatively thick portions. Due to this, as shown in FIG. 8, the nozzle 21a moves directly above a non-relatively thick portion Wb at a high speed, while is reduced in speed in accordance with the thickness of a relatively thick portion Wa when arriving over the relatively thick portion Wa. As a result, the etching time of a relatively thick portion Wa becomes longer, so the relatively thick portion Wa is flattened. By successively locally etching the entire surface of the silicon wafer W in this way, the surface of the silicon wafer W is flattened.

When the local etching step is completed, the second transport step is performed.

That is, the gate valve 25f of the chamber 25 shown in FIG. 1 is opened, the transfer robot 4 is used to take out the silicon wafer W finished being locally etched from the chamber 25 and transport it to the table 29 side, and the silicon wafer W is placed on the table 29 in a state with its front surface facing down.

This being done, the CMP apparatus 3 performs a chemical mechanical polishing step as a smoothing step.

That is, as shown by the one-dot dash line, the assembly of the carrier 31, cylinder 35, and motor 36 assembled together moves directly above the silicon wafer W on the table 29. The cylinder 35 is then driven to lower the carrier 31 and house the silicon wafer W in the depression 37 (see FIG. 6). In this state, the air pump 33 is driven to make the air holes 31c of the carrier 31 negative pressure in state, whereby the silicon wafer W is held by the backing sheet 37a by suction.

The carrier 31 holding the silicon wafer W by suction rises, the assembly moves directly above the platen 30, then the cylinder 35 and motor 36 are driven to lower the rotating carrier 31 to the rotating platen 30 side. The silicon wafer W is pressed against the polishing pad 30a of the platen 30 by a predetermined pressure.

In this state, the slurry S is supplied from the nozzle 32 to between the silicon wafer W and the platen 30, the surface of the silicon wafer W is smoothed to a mirror finish surface, and the projections and other surface roughness are ground away to smooth the silicon wafer W.

When the above chemical mechanical polishing step is finished, the carrier 31 rises in a state holding the silicon wafer W by suction, then, as shown by the two-dot dash line, the assembly moves directly above the table 39 and the carrier 31 descends. By driving the air pump 33 in reverse, the air holes 31c of the carrier 31 are returned to a positive pressure state and the silicon wafer W is released from the backing sheet 37a and placed on the table 39.

In this way, according to the wafer flattening system of this embodiment, it is possible to substantially completely eliminate the roughness of the surface of a silicon wafer W by local etching, so it is possible to improve the RMS of the silicon wafer W. Further, since the natural oxide film is removed before the local etching, the occurrence of white turbidity after local etching can be prevented. Further, since the natural oxide film removing step, the local etching step, and the smoothing step can be performed consecutively and automatically, the work efficiency can be improved.

To verify this point, the present inventors used as the solution A in the solution tank 11 of the natural oxide film removing device 1 an aqueous solution of hydrofluoric acid comprised of a mixture of 17% of ammonium fluoride ($NH_4F$), 0.7% of hydrofluoric acid (HF), and 82.3% of pure water, immersed a silicon wafer W with an RMS of 0.9 nm in this solution A for 2 minutes, then washed it in the washer 12. Then, the silicon wafer W was placed on the chuck 26 of the local etching device 2 and $SF_6$ gas was fed to the inside of the alumina discharge tube 21 at a flow rate of 250 sccm. Substantially simultaneously with this, a microwave M of an output voltage of 350 W was generated by the microwave generator 20a toward the $SF_6$ gas and the resultant activated species gas G of a gas pressure of 1.5 Torr was sprayed from the nozzle 21a to locally etch the entire surface of the silicon wafer W. Next, the CMP apparatus 3 was used to give a mirror finish surface of exactly 0.2 μm to the surface of the silicon wafer W flattened by the local etching apparatus 2 and the RMS of the silicon wafer W was measured, whereupon it was found that the RMS was reduced to 0.35 nm.

That is, by performing the natural oxide film removing step, the local etching step, and the smoothing step, the RMS of the surface of the silicon wafer W was improved from 0.9 nm to 0.35 nm.

(Second Embodiment)

Figure 9:
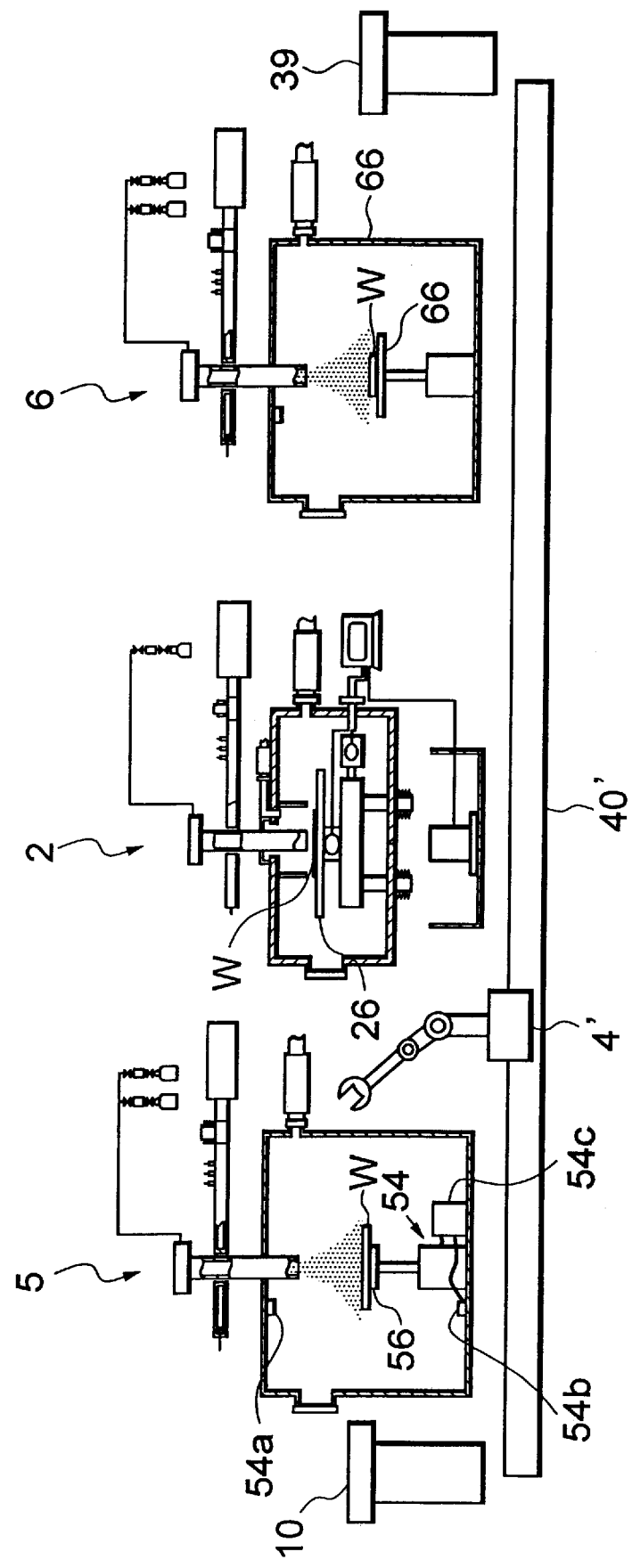
FIG. 9 is a schematic view of the configuration of a wafer flattening system according to a second embodiment of the present invention.

FIG. 9 is a schematic view of the configuration of a wafer flattening system according to a second embodiment of the present invention. Note that elements the same as elements shown in FIG. 1 to FIG. 8 are explained given the same reference numerals.

This wafer flattening system differs from the first embodiment in the point that the natural oxide film removing step, the local etching step, and the smoothing step can be performed in the state holding the silicon wafer W dry.

Reference numeral 5 in FIG. 9 represents the natural oxide film removing device, while reference numeral 6 represents the smoothing apparatus.

Figure 10:
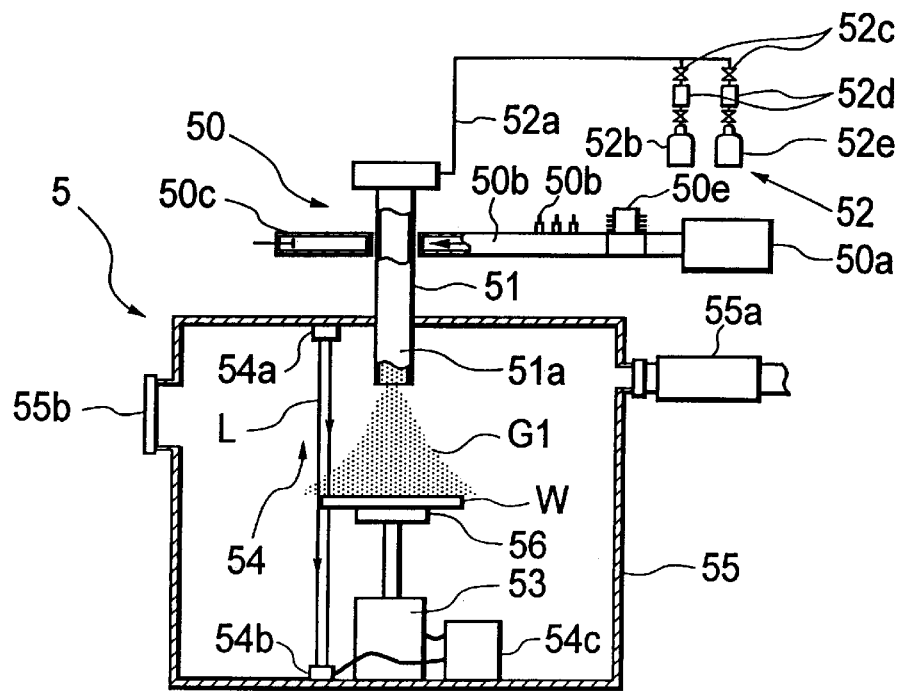
FIG. 10 is a sectional view of a natural oxide film removing device used for the wafer flattening system shown in FIG. 9.

The natural oxide film removing device 5, as shown in FIG. 10, is comprised of a plasma generator 50, an alumina discharge tube 51, a gas feeder 52, a motor 53 for rotating a chuck 56, and a positioning mechanism 54.

The plasma generator 50 is the same in structure as the plasma generator 20 of the local etching apparatus 2 and is comprised of a microwave generator 50a and a waveguide 50b. That is, the microwave generator 50a is a magnetron for generating a microwave M of a predetermined frequency, while the waveguide 50b has attached to it a reflection plate 50c, a 3-stub tuner 50d, and an isolator 50e. The alumina discharge tube 51 is also the same in structure as the alumina discharge tube 21 of the local etching apparatus 2 and has a feed pipe 52a of the gas feeder 52 connected to its top end.

The gas feeder 52 has a $CF_4$ (carbon tetrafluoride) gas cylinder 52b and an $H_2$ (hydrogen) gas cylinder 52e. These gas cylinders 52b and 52e are connected to the feed pipe 52a through valves 52c and flow rate controllers 52d. In the gas feeder 52, a mixed gas with a ratio of the $H_2$ gas to the $CF_4$ gas set to 0.1% to 50% is fed to the alumina discharge tube 51.

A silicon wafer W is placed on the chuck 56 inside the chamber 55, but since the activated species gas G1 from the nozzle 51a is designed to be sprayed over the entire surface of the silicon wafer W on the chuck 56, the distance between the nozzle 51a and the chuck 56 is set extremely large compared with the distance between the nozzle 21a and the chuck 26 of the local etching apparatus 2.

The chamber 55, in the same way as the chamber 25 of the local etching apparatus 2, is provided with a vacuum pump 55a for lowering the pressure in the chamber 55.

The motor 53 is for making the chuck 56, which has a smaller diameter than the diameter of the silicon wafer W, rotate, so the shaft is connected to the center part of the chuck 56.

The positioning mechanism 54 is a well known mechanism for controlling the motor 53 to position the flat or notch of the silicon wafer W and is provided with a light emitting diode 54a, a light receiving element 54b, and a controller 54c. That is, the light L from the light emitting diode 54a is received by the light receiving element 54b arranged below the silicon wafer W. A voltage signal V corresponding to the amount of light received is output from the light receiving element 54b to the controller 54c. The controller 54c functions to stop the motor 53 when the voltage of the voltage signal V which is input becomes more than a reference voltage V1 and the voltage changes from an increase to decrease.

Figure 11:
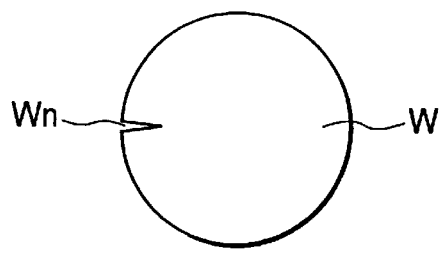
FIG. 11 is a plan view of a silicon wafer having a notch.
Figure 12:
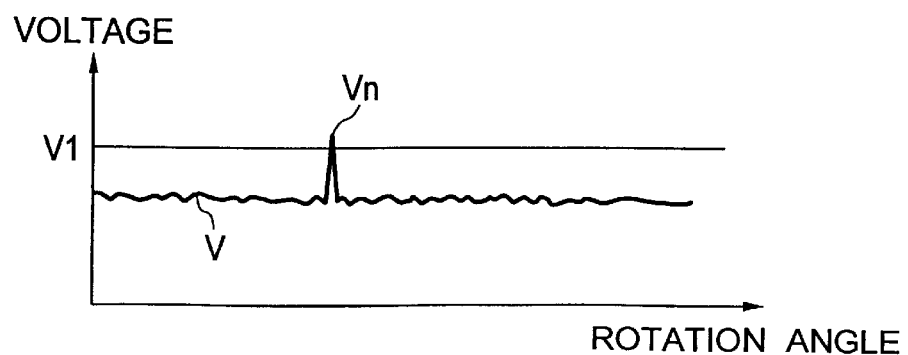
FIG. 12 is a diagram of a voltage waveform when positioning the silicon wafer of FIG. 11.
Figure 13:
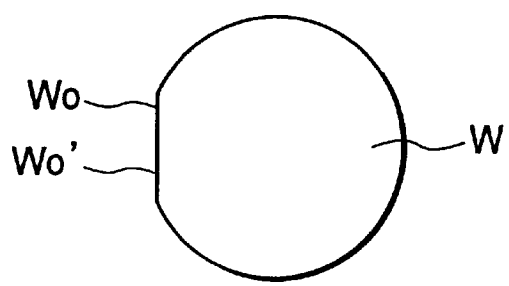
FIG. 13 is a plan view of a silicon wafer having a flat.
Figure 14:
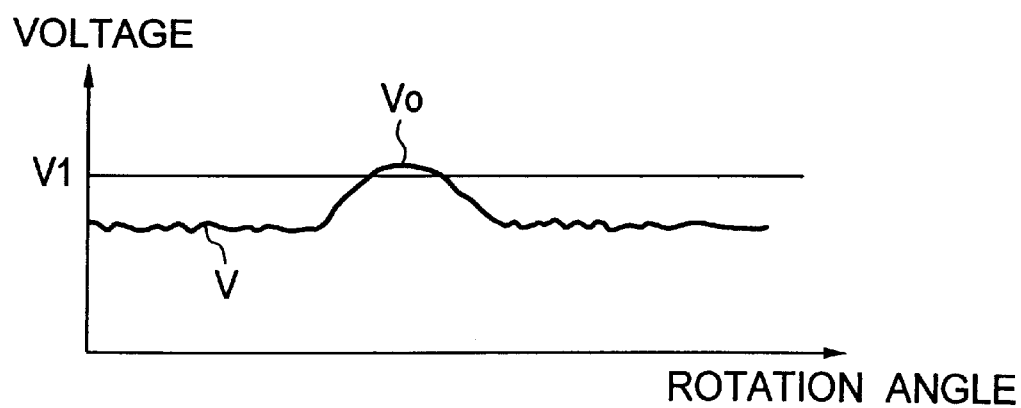
FIG. 14 is a diagram of the voltage waveform when positioning the silicon wafer shown in FIG. 9.

Due to this, as shown in FIG. 11, when a silicon wafer W having the notch Wn rotates, when the notch Wn is positioned directly above the light receiving element 54b, as shown in FIG. 12, the voltage signal V which had been a substantially constant voltage up to then rapidly rises, so the controller 54c makes the motor 53 stop rotating substantially simultaneously with the input of the rapidly rising voltage Vn so as to position the notch Wn substantially directly above the light receiving element 54b. Further, as shown in FIG. 13, when a silicon wafer W having the flat Wo rotates, when the flat Wo passes directly above the light receiving element 54b, as shown in FIG. 14, the voltage signal V smoothly rises. The controller 54c makes the motor 53 stop rotating substantially simultaneously with the input of the maximum voltage Vo so as to position the center Wo' of the flat Wo substantially directly above the light receiving element 54b.

Figure 15:
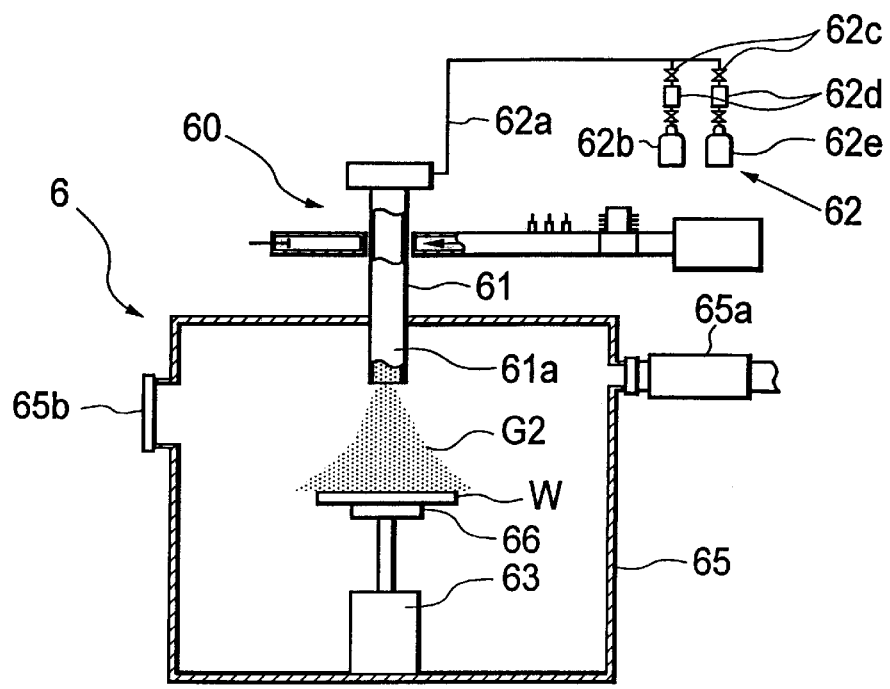
FIG. 15 is a sectional view of a smoothing apparatus used for the wafer flattening system shown in FIG. 9.

On the other hand, the smoothing apparatus 6, as shown in FIG. 15, is provided with a plasma generator 60, an alumina discharge tube 61, a gas feeder 62, and a motor 63 for making a chuck 66 rotate.

The plasma generator 60 also has the same structure as the plasma generator 20 of the local etching apparatus 2, while the alumina discharge tube 61 has the same structure as the alumina discharge tube 21 of the local etching apparatus 2, but the gas feeder 62 has a $CF_4$ gas cylinder 62b and an $O_2$ (oxygen) gas cylinder 62e. These gas cylinders 62b, 62e are connected through valves 62c and flow rate controllers 62d to the feed pipe 62a. In this gas feeder 62, a mixed gas with a ratio of the $O_2$ gas to the $CF_4$ gas set to 200% to 400% is fed to the alumina discharge tube 61.

The distance between the nozzle 61a of the alumina discharge tube 61 and the chuck 66, like the natural oxide film removing device 5, is set extremely large compared with the distance between the nozzle 21a and the chuck 26 of the local etching apparatus 2 so that the activated species gas G2 from the nozzle 61a is sprayed over the entire surface of the silicon wafer W on the chuck 66.

The chamber 65, in the same way as the chamber 55 of the natural oxide film removing device 5, is provided with a vacuum pump 65a.

The motor 63 is for making the chuck 66, which has a larger diameter than the diameter of the silicon wafer W, rotate, so the shaft is connected to the center part of the chuck 66.

The transfer robot 4' shown in FIG. 9 carries the silicon wafer W finished being smoothed from the chuck 66 of the smoothing apparatus 6, places it on the table 39, then moves on the rail 40' to the local etching apparatus 2 side. Further, it carries the silicon wafer W finished being locally etched out from the chuck 26 and moves to the smoothing apparatus 6 side where it places the held silicon wafer W on the chuck 66. Suitably thereafter, the transfer robot 4' moves to the natural oxide film removing device 5 side where it carries the silicon wafer W finished being processed by the natural oxide film removing device out from the chuck 56, then moves to the local etching apparatus 2 side where it places the silicon wafer W on the chuck 26. Further, it functions to place a silicon wafer W on the table 10 on to the chuck 56 of the natural oxide film removing device 5.

Next, the operation of the wafer flattening system of this embodiment will be explained.

First, in the natural oxide film removing step, a silicon wafer W finished being processed at the previous step and placed on the table 10 is held by the transfer robot 4' and placed on the chuck 56 of the natural oxide film removing device 5. The positioning mechanism 54 shown in FIG. 10 is then used to control the motor 53 to position the flat or notch of the silicon wafer W substantially directly above the light receiving element 54b.

In parallel with this positioning operation, the gas feeder 52 shown in FIG. 10 is used to feed a mixed gas with a ratio of the $H_2$ gas to the $CF_4$ gas set to 0.1% to 50% to the alumina discharge tube 51. The plasma generator 50 is used to cause plasma discharge.

The activated species gas G1 produced by this plasma discharge is sprayed from the nozzle 51a of the alumina discharge tube 51 and diffuses over the entire surface of the silicon wafer W.

Due to this, it is understood that the reaction of $2CF_4 + H_2 \rightarrow 2CF_3^*$ (radical of $CF_3$)$+2HF$ and the reaction of $SiO_2 + 4HF \rightarrow SiF_4 + 2H_2O$ occur. As a result, the natural oxide film on the surface of the silicon wafer W is etched by the radicals contained in the activated species gas G1.

When the natural oxide film removing step is finished, a first transport step is performed and the silicon wafer W on the chuck 56 of the natural oxide film removing device 1 is transported on to the chuck 26 of the local etching apparatus 2 by the transfer robot 4' shown in FIG. 9.

Next, the local etching step is performed at the local etching apparatus 2 and the surface of the silicon wafer W is flattened.

When the local etching step is finished, the second transport step is performed and the transfer robot 4' is used to take out the silicon wafer W finished being locally etched from the chuck 26 and transport it on to the chuck 66 of the chamber 65 of the smoothing apparatus 6.

This being done, the smoothing step is performed at the smoothing apparatus 6.

That is, the motor 63 shown in FIG. 15 is used to make the chuck 66 holding the silicon wafer W by suction rotate and the gas feeder 62 is used to feed a mixed gas with a ratio of the $O_2$ gas to the $CF_4$ gas set to 200% to 400% to the alumina discharge tube 61. The mixed gas is made to discharge by the plasma generator 60.

Figure 16:
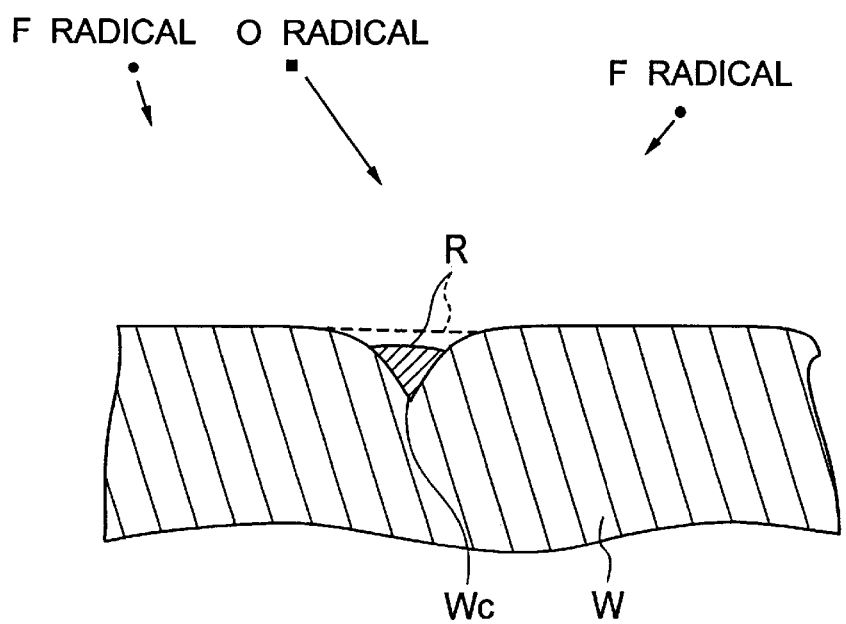
FIG. 16 is a sectional view of a smoothing apparatus showing a smoothing step.

The activated species gas G2 produced by this plasma discharge is sprayed from the nozzle 61a of the alumina discharge tube 61 and diffuses over the entire surface of the silicon wafer W. Due to this, the surface of the silicon wafer W is etched by the F radicals or O radicals contained in the activated species gas G2. That is, when the activated species gas G2 is sprayed on to the surface of the silicon wafer W, as shown in FIG. 16, due to the presence of O radicals, a reaction product R thought to be SiOxFy (x, y=1, 2 . . . ) is produced. Further, the F radicals etch the surface of the silicon wafer W. Further, the reaction product R is produced on the entire surface of the silicon wafer W, but due to the vapor pressure, the majority of the reaction product R evaporates, while the reaction product R deposited in the slight depressions Wc causing roughness remain without evaporating. Therefore, the reaction product R deposits in the depressions Wc to protect the depressions from etching by the F radicals, while only the portions other than the depressions Wc are etched by the F radicals.

Therefore, as shown by the broken lines in FIG. 16, the plasma generator 60 stops being driven at the point of time when the surface of the reaction product R gradually deposited in the depressions Wc and the surface of the portions which are etched become substantially equal.

Due to this, the smoothing step is completed and a silicon wafer W smoothed over substantially its entire surface can be obtained.

In this way, according to the wafer flattening system of this embodiment, not only it is possible to reduce the surface roughness of the silicon wafer W, but it is also possible to perform the natural oxide film removing step, the local etching step, and the smoothing step while maintaining the silicon wafer W in a dry state, so the washing step can be eliminated and the speed of work processing can be increased by that extent.

The inventors conducted the following experiment in order to verify the improvement in the surface roughness of the silicon wafer W by the wafer flattening system of this embodiment.

In the natural oxide film removing device 5, the flow rates of the $CF_4$ gas and the $H_2$ gas were set to 500 sccm and 50 sccm respectively and a mixed gas of the same was fed to the alumina discharge tube 51. Substantially simultaneously with this, a microwave M of an output voltage of 200 W was generated by the microwave generator 50a toward the mixed gas and the resultant activated species gas G1 of a gas pressure of 1.1 Torr was sprayed from the nozzle 51a to etch the entire surface of the silicon wafer W.

Suitably thereafter, the silicon wafer W was placed on the chuck 26 of the local etching apparatus 2 and $SF_6$ gas was fed to the alumina discharge tube 21 at a flow rate of 150 sccm. Substantially simultaneously with this, a microwave M of an output voltage of 350 W was generated by the microwave generator 20a toward the $SF_6$ gas and the resultant activated species gas G of a gas pressure of 1.5 Torr was sprayed from the nozzle 21a to locally etch the entire surface of the silicon wafer W.

Next, in the smoothing apparatus 6, the flow rates of the $CF_4$ gas and the $O_2$ gas were set to 150 sccm and 600 sccm respectively and a mixed gas of the same was fed to the alumina discharge tube 61. Further, a microwave M of an output voltage of 200 W was generated by the microwave generator 60a toward the mixed gas and the resultant activated species gas G2 of a gas pressure of 2.0 Torr was sprayed from the nozzle 61a to etch the entire surface of the silicon wafer W.

After the above processing, the surface roughness of the silicon wafer W was measured, whereupon the RMS was found to be reduced to 0.30 nm.

The rest of the configuration and the mode of operation and advantageous effects are similar to those of the first embodiment explained above, so explanations thereof will be omitted.

(Third Embodiment)

Figure 17:
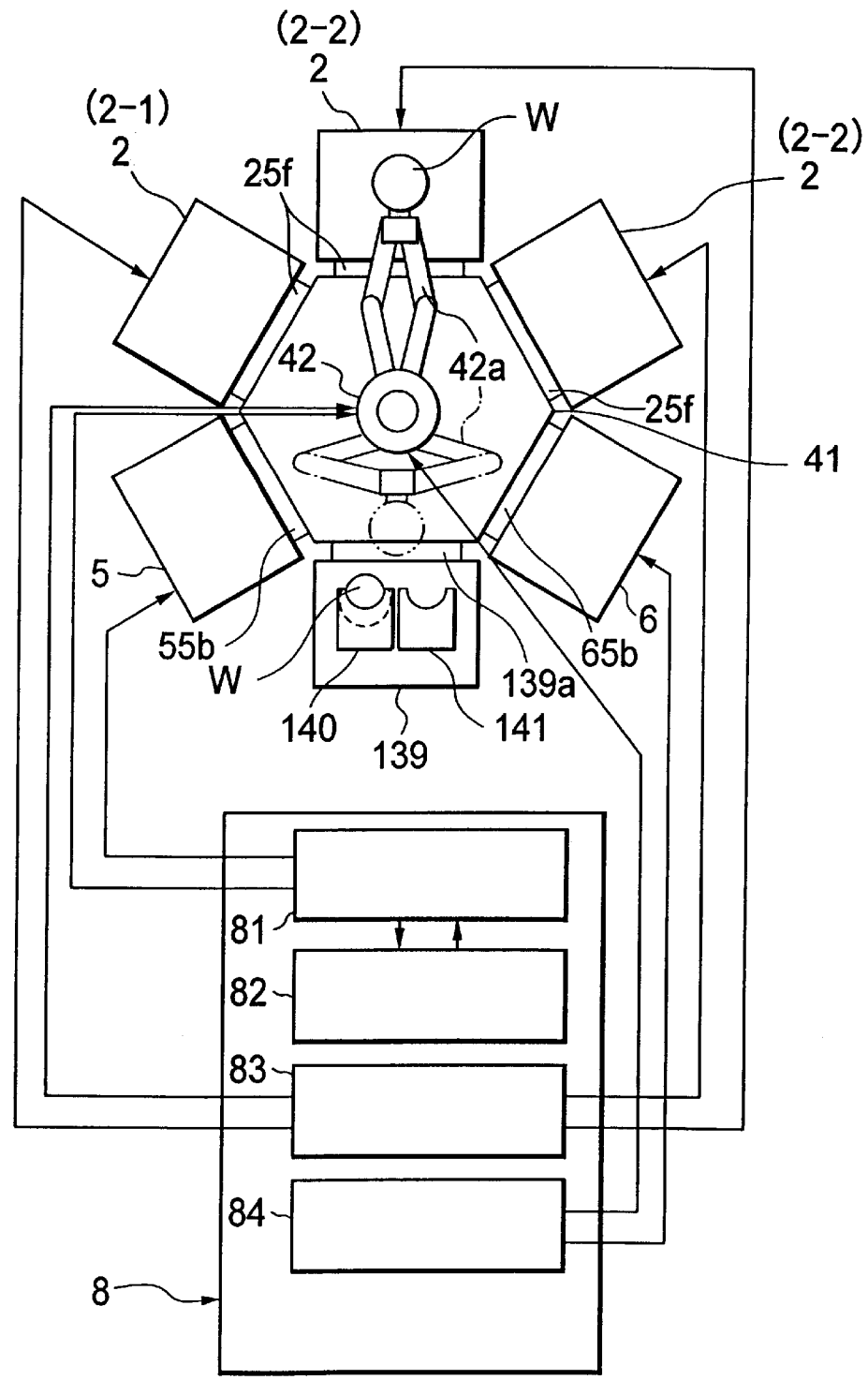
FIG. 17 is a block diagram of a wafer flattening system according to a third embodiment of the present invention.

FIG. 17 is a block diagram of a wafer flattening system according to a third embodiment of the present invention. Note that elements the same as elements shown in FIG. 1 to FIG. 16 are explained given the same reference numerals.

The wafer flattening system of this embodiment differs from the wafer flattening system of the second embodiment in the point that three local etching apparatuses 2 are provided and the natural oxide film removing processing, the local etching processing, and the smoothing processing can be performed without exposing the silicon wafer W to the atmosphere.

In FIG. 17, reference numeral 139 is a load and unload chamber. Inside this load and unload chamber 139 are arranged a load cassette 140 storing unprocessed silicon wafers W and an unload cassette 141 storing processed silicon wafers W. Further, the load and unload chamber 139 is connected through a wafer load and unload port 139a to a robot chamber 41 of a hexagonal shape seen from a plan view.

In the robot chamber 41 is provided a single robot 42 serving as a first transport device and a second transport device.

The robot 42 makes an arm 42a holding a silicon wafer W extend, retract, and rotate so as to unload a silicon wafer W from the load cassette 140, load and unload silicon wafers W to and from the natural oxide film removing device 5, the local etching device 2, and the smoothing device 6, and load silicon wafers W to the unload cassette 141.

The natural oxide film removing device 5 is connected through the gate valve 55b to the robot chamber 41. The three local etching apparatuses 2 (hereinafter also referred to as the local etching apparatus 2-1, the local etching apparatus 2-2, and the local etching apparatus 2-3) are connected through the gate valves 25f to the robot chamber 41, respectively. The smoothing apparatus 6 is connected through a gate valve 65b to the robot chamber 41.

The natural oxide film removing device 5, local etching apparatuses 2-1 to 2-3, and smoothing apparatus 6 assembled around the robot 42 and robot chamber 41 equipped in this way are controlled by a controlling apparatus 8.

The controlling apparatus 8 is provided with a natural oxide film removing device controller 81, a transport sequence controller 82, a local etching apparatus controller 83, and a smoothing apparatus controller 84.

The natural oxide film removing device controller 81 functions to control the robot 42 so that the robot 42 takes out a silicon wafer W from the load cassette 140 and loads it through the open gate valve 55b to the natural oxide film removing device 5. Further, the natural oxide film removing device controller 81 makes the natural oxide film removing device 5 with a closed gate valve 55b operate for exactly a time T enabling natural oxide film removal. That is, it makes the positioning mechanism 54, the gas feeder 52, and the plasma generator 50 shown in FIG. 10 operate for exactly the time T for natural oxide film removal to remove the natural oxide film from the surface of the silicon wafer W. Further, the natural oxide film removing device controller 81 controls the robot 42 so that the robot 42 takes out the silicon wafer W finished being removed of the natural oxide film from the natural oxide film removing device 5 with an open gate valve 55b after the elapse of the above time T enabling natural oxide film removal and transport the silicon wafer W to a not operating local etching apparatus with an open gate valve 25f among the local etching apparatuses 2-1 to 2-3.

The transport sequence controller 82 is a portion for controlling the above natural oxide film removing device controller 81 and controls the natural oxide film removing device controller 81 so that the robot 42 transports a silicon wafer W taken out from the natural oxide film removing device 5 to the local etching apparatus with the longest non-operating time out of the local etching apparatuses 2-1 to 2-3. Specifically, it monitors the data of the time m×t (hereinafter simply referred to as "mT", m being a positive number) enabling local etching processing of the local etching apparatuses 2 sent from the later explained local etching apparatus controller 83 and makes the silicon wafer W from the natural oxide film removing device 5 be transported to the local etching apparatus 2 with the longest time after the elapse of the time mT enabling local etching processing among the local etching apparatuses 2 for which the time mT enabling local etching processing has elapsed. For example, if the local etching apparatus 2-2 and the local etching apparatus 2-3 are not operating, when the time elapsed after the stop of the operation of the local etching apparatus 2-2 is 2 minutes and the time elapsed after the stop of operation of the local etching apparatus 2-3 is 1 minute, it controls the natural oxide film removing device 81 so that the robot 42 transports the silicon wafer W to the local etching apparatus 2-2.

The local etching apparatus controller 83 functions to detect the presence of a silicon wafer W inside a local etching apparatus 2 and make that local etching apparatus 2 operate for exactly the time mT enabling local etching processing when a silicon wafer W is placed in that local etching apparatus 2 by the robot 42. Further, the local etching apparatus controller 83 functions to control the robot 42 so that the robot 42 takes out a silicon wafer W inside a local etching apparatus 2 and transport the silicon wafer W to the not operating smoothing apparatus 6 with an open gate valve 65*b* when the time mT enabling local etching processing has elapsed at a local etching apparatus 2.

The smoothing apparatus controller 84 functions to detect the presence of a silicon wafer W in the smoothing apparatus 6 and make the smoothing apparatus 6 operate for exactly time t enabling smoothing when a silicon wafer W is placed in the smoothing apparatus 6 by the robot 42. Further, the smoothing apparatus controller 84 functions to take out the silicon wafer W inside the smoothing apparatus 6 and store it in the unload cassette 141 by the robot 42 when the time t enabling smoothing has elapsed at the smoothing apparatus 6.

Next, the operation of the wafer flattening system of this embodiment will be explained.

Here, to facilitate understanding, the explanation will be given assuming T=t=1 minute.

First, an explanation will be given of the case of processing 11 silicon wafers W under the condition of m=4 (>N=3).

Figure 18:
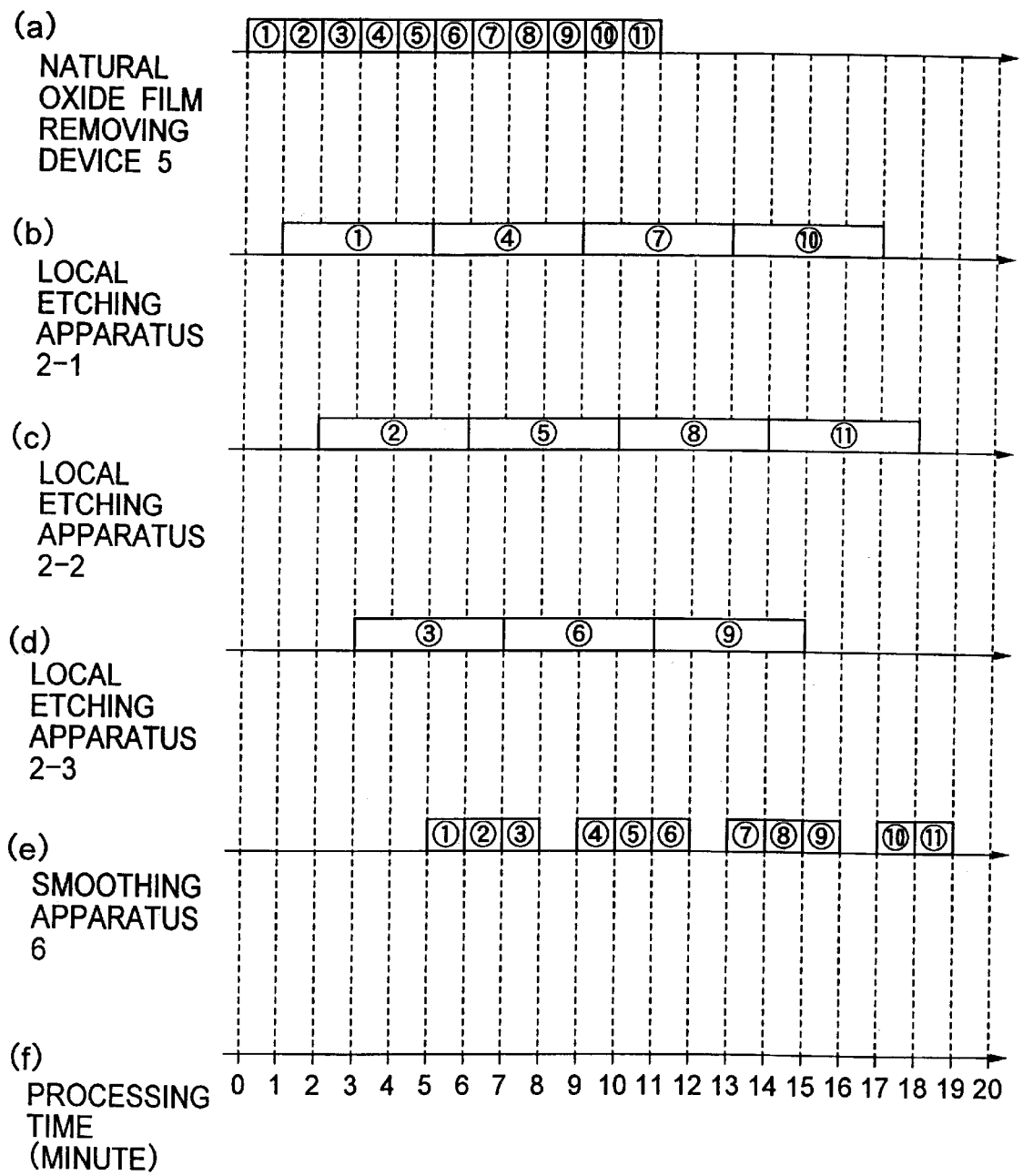
FIG. 18 is a time chart of the processing time among a natural oxide film removing device, three local etching apparatuses, and a smoothing apparatus under the conditions of m=4 (>N=3)

FIG. 18 is a time chart of the processing times of the apparatuses such as the natural oxide film removing device 5, the local etching apparatuses 2-1 to 2-3, and the smoothing apparatus 6 under the above conditions. Note that the circled numbers in the figure show the sequence of the silicon wafer W processed. For example, circle 1 indicates the first silicon wafer W, while circle 2 indicates the second silicon wafer W. Further, the time of transport to the apparatuses by the robot 42 is omitted.

When a load cassette 140 is placed in the load and unload chamber 139 and the robot chamber 41 and the load and unload chamber 139 are evacuated, the robot 42 is controlled by the natural oxide film removing device controller 81 of the controlling apparatus 8 and a first silicon wafer W in the unload cassette 141 is loaded to the natural oxide film removing device 5 by the robot 42 (first step).

This being done, the natural oxide film removing device 5 is operated by the natural oxide film removing device controller 81 and the silicon wafer W is positioned and removed of its natural oxide film (second step). This processing on the first silicon wafer W for natural oxide film removal is performed from minute 0 to minute 1 as shown by (a) and (f) of FIG. 18.

When 1 minute passes after the silicon wafer W was transported to the natural oxide film removing device 5, the silicon wafer W is taken out by the robot 42 controlled by the natural oxide film removing device controller 81 and transported to the inside of the local etching apparatus 2-1 (third step). Due to this, the local etching apparatus 2-1 is operated by the local etching apparatus controller 83 and the silicon wafer W is locally etched (fourth step). This processing is performed for 4 minutes from minute 1 to minute 5 as shown in (b) and (f) of FIG. 18.

Further, when the first silicon wafer W is transported to the local etching apparatus 2-1, as shown by (a) in FIG. 18, a second silicon wafer W is immediately taken out by the robot 42 from the load cassette 140 and loaded to the inside of the natural oxide film removing device 5, where the second silicon wafer W is processed to position it and remove its natural oxide film. This processing is performed from minute 1 to minute 2. After minute 2 passes, as shown by (c) in FIG. 18, the silicon wafer W is transported by the robot 42 from the natural oxide film removing device 5 to the local etching apparatus 2-2. In the local etching apparatus 2-2, the second silicon wafer W is locally etched from minute 2 to minute 6.

A third silicon wafer W is similarly transported from the load cassette 140 to the inside of the natural oxide film removing device 5 and is processed to remove its natural oxide film for 1 minute by the natural oxide film removing device 5 immediately after the second silicon wafer W is transported from the natural oxide film removing device 5 to the local etching apparatus 2-2. Suitably thereafter, the third silicon wafer W is transported to the local etching apparatus 2-3 and is locally etched by the local etching apparatus 2-3 from minute 3 to minute 7.

Immediately after the third silicon wafer W is transported to the local etching apparatus 2-3, a fourth silicon wafer W is loaded to the natural oxide film removing device 5 where it is processed to remove its natural oxide film from minute 3 to minute 4. After the processing of this fourth silicon wafer W, that is, at minute 4, the fourth silicon wafer W is kept waiting until there is a non-operating local etching apparatus 2.

Next, at minute 5, as shown by (a) and (b) in FIG. 18, the local etching apparatus 2-1 stops operating, the first silicon wafer W is transported by the robot 42 controlled by the local etching apparatus controller 83 from the local etching apparatus 2-1 to the smoothing apparatus 6 (fifth step), and the smoothing apparatus 6 is operated for exactly 1 minute from minute 5 to minute 6 by the control of the smoothing apparatus controller 84 (sixth step). Further, the smoothing apparatus 6 stops operating after the smoothing processing, that is, at minute 6, then the first silicon wafer W is stored by the robot 42 controlled by the smoothing apparatus controller 84 in the unload cassette 141 (seventh step).

The fifth and the sixth silicon wafers W, as shown in (a) and (c) to (f) of FIG. 18, are also transported to the local etching apparatus 2-2 and the local etching apparatus 2-3 immediately after the second silicon wafer W is transported from the local etching apparatus 2-2 to the smoothing apparatus 6 and immediately after the third silicon wafer W is transported from the local etching apparatus 2-3 to the smoothing apparatus 6. These silicon wafers W are each locally etched for 4 minutes.

Further, the second and third silicon wafers W transported to the smoothing apparatus 6, as shown in (f) of FIG. 18, are also successively stored in the unload cassette 141 after smoothing.

The seventh to the 11th silicon wafers W are also similarly transported and processed. The processing times are as shown in FIG. 18.

From the above, the time required for processing 11 silicon wafers W in the wafer flattening system of this embodiment under the conditions of m=4 is, as shown in (f) of FIG. 18, 19 minutes.

As opposed to this, in FIG. 17, where there is a single local etching apparatus 2, the time for processing 11 silicon wafers W is 46 minutes. Therefore, the throughput of processing by the wafer flattening system of this embodiment is approximately 2.4 times the throughput of the case of a single local etching apparatus 2.

Next, an explanation will be given of the case of processing 11 silicon wafers W under the conditions of m=3 (=N).

Figure 19:
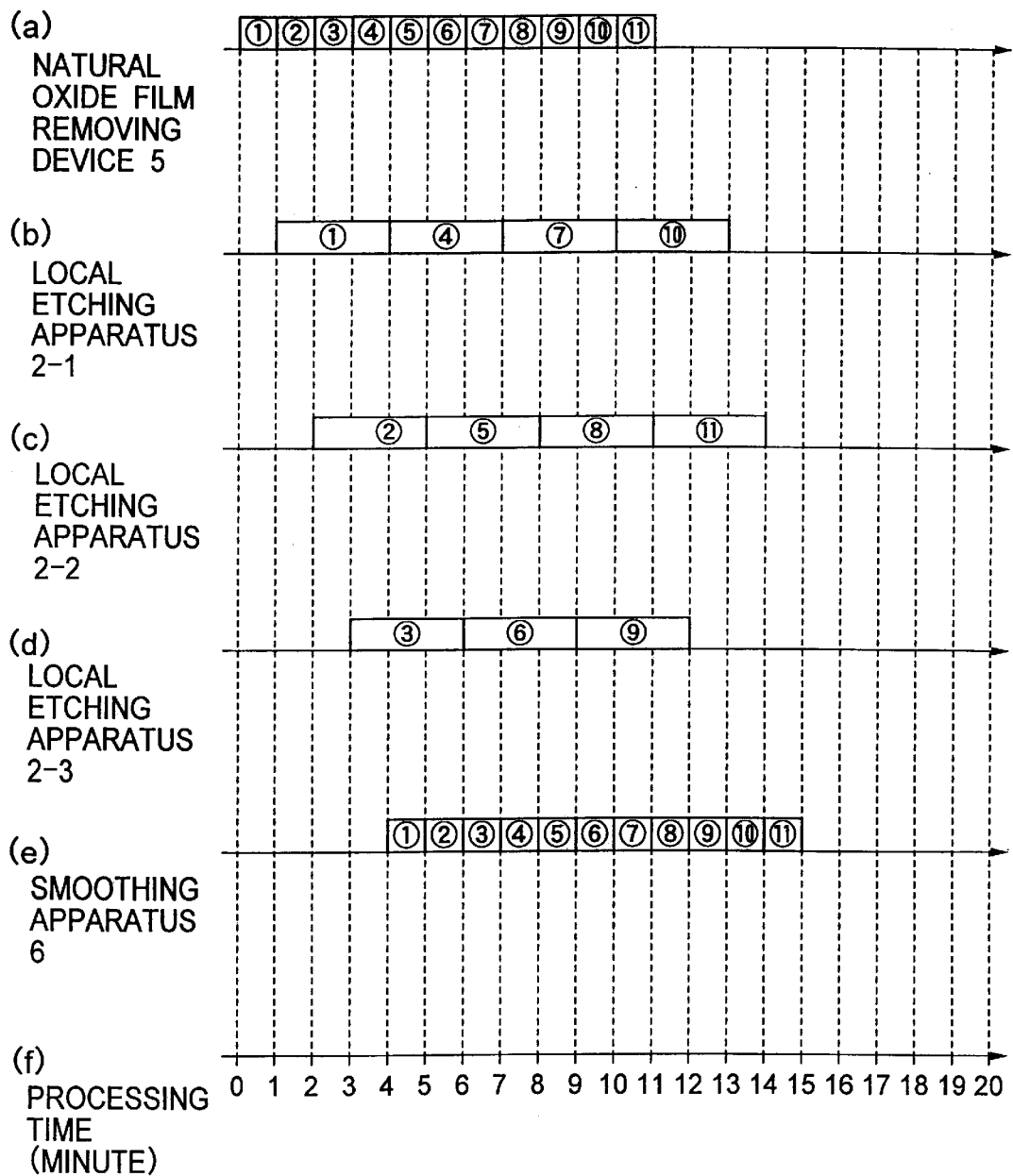
FIG. 19 is a time chart of the processing time among a natural oxide film removing device, three local etching apparatuses, and a smoothing apparatus under the conditions of m=3 (=N)

FIG. 19 is a time chart of the processing times of the apparatuses such as the natural oxide film removing device 5, the local etching apparatuses 2-1 to 2-3, and the smoothing apparatus 6 under the above conditions.

As shown in FIG. 19, in this case, the time required for processing 11 silicon wafers W is 15 minutes. This is shorter than the case of the above m=4. That is, the throughput of processing under the conditions of m=3 becomes as much as about 3 times the throughput in the case of a single local etching apparatus 2.

It is believed that the throughput is increased under these conditions due to the fact that silicon wafers W finished being processed for natural oxide film removal by the natural oxide film removing device 5 are not kept waiting and can be immediately transported to non-operating local etching apparatuses 2.

Finally, an explanation will be given of the case of processing 11 silicon wafers W under the condition of m=2 (<N).

Figure 20:
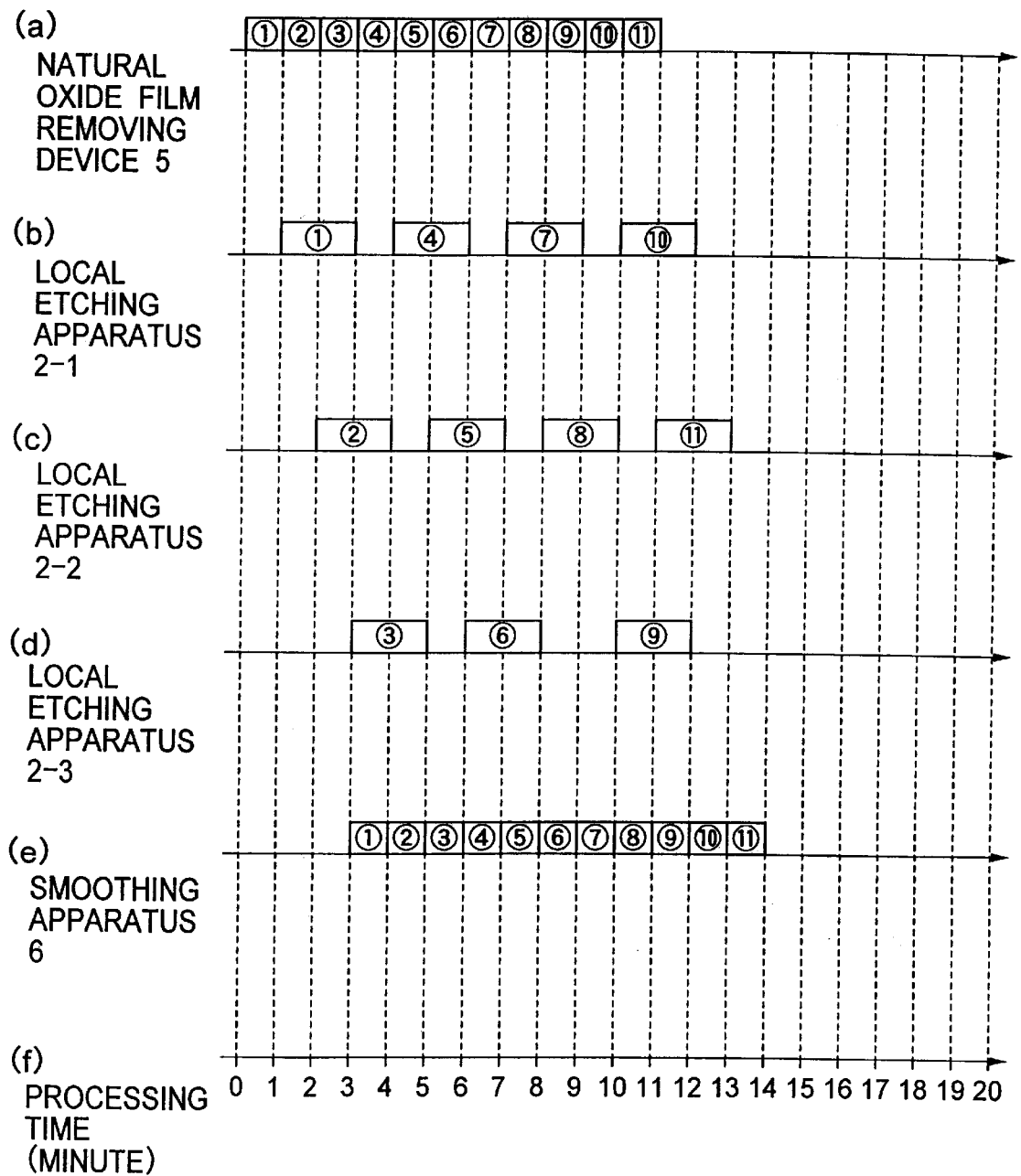
FIG. 20 is a time chart of the processing time among a natural oxide film removing device, three local etching apparatuses, and a smoothing apparatus under the conditions of m=2 (<N)

FIG. 20 is a time chart of the processing times of the apparatuses such as the natural oxide film removing device 5, the local etching apparatuses 2-1 to 2-3, and the smoothing apparatus 6 under the above conditions.

As shown in FIG. 20, in this case, the time required for processing 11 silicon wafers W is 14 minutes. This is shorter than the case of the above m=3. It is believed that this is due to the processing of a plurality of silicon wafers W by a large number of local etching apparatuses 2 with short times mT enabling local etching processing.

In this case, since there are cases where there are simultaneously a plurality of non-operating local etching apparatuses 2, it is not possible to determine to which local etching apparatus 2 to transport a silicon wafer W finished being processed for natural oxide film removal at the natural oxide film removing device 5 with just the function of the natural oxide film removing device controller 81. In the wafer flattening system of this embodiment, however, since the transport sequence controller 82 controls the natural oxide film removing device controller 81 to transport the silicon wafer W to the local etching apparatus 2 with the longest non-operating time, it is possible to execute the processing of the system as a whole smoothly. For example, as shown in (a) to (c) of FIG. 20, at the point of time (minute 4) where the fourth silicon wafer W is taken out from the natural oxide film removing device 5, two local etching apparatuses 2-1, 2-2 are simultaneously not operating. The local etching apparatus 2-1, however, stopped operating 1 minute ago, while the local etching apparatus 2-2 just stopped operation, so the fourth silicon wafer W is transported to the local etching apparatus 2-1 with the longest non-operating time under the control of the natural oxide film removing device controller 81 controlled by the transport sequence controller 82.

In this way, according to the wafer flattening system of this embodiment, it is possible to further improve the throughput of the processing. Further, since it is possible to perform the processing without exposure to the atmosphere, it is possible to prevent the production of a natural oxide film, the deposition of dust, etc. As a result, it is possible to shorten the time for the processing work by that extent.

The rest of the configuration and the mode of operation and advantageous effects are similar to those of the second embodiment explained above, so explanations thereof will be omitted.

(Fourth Embodiment)

Figure 21:
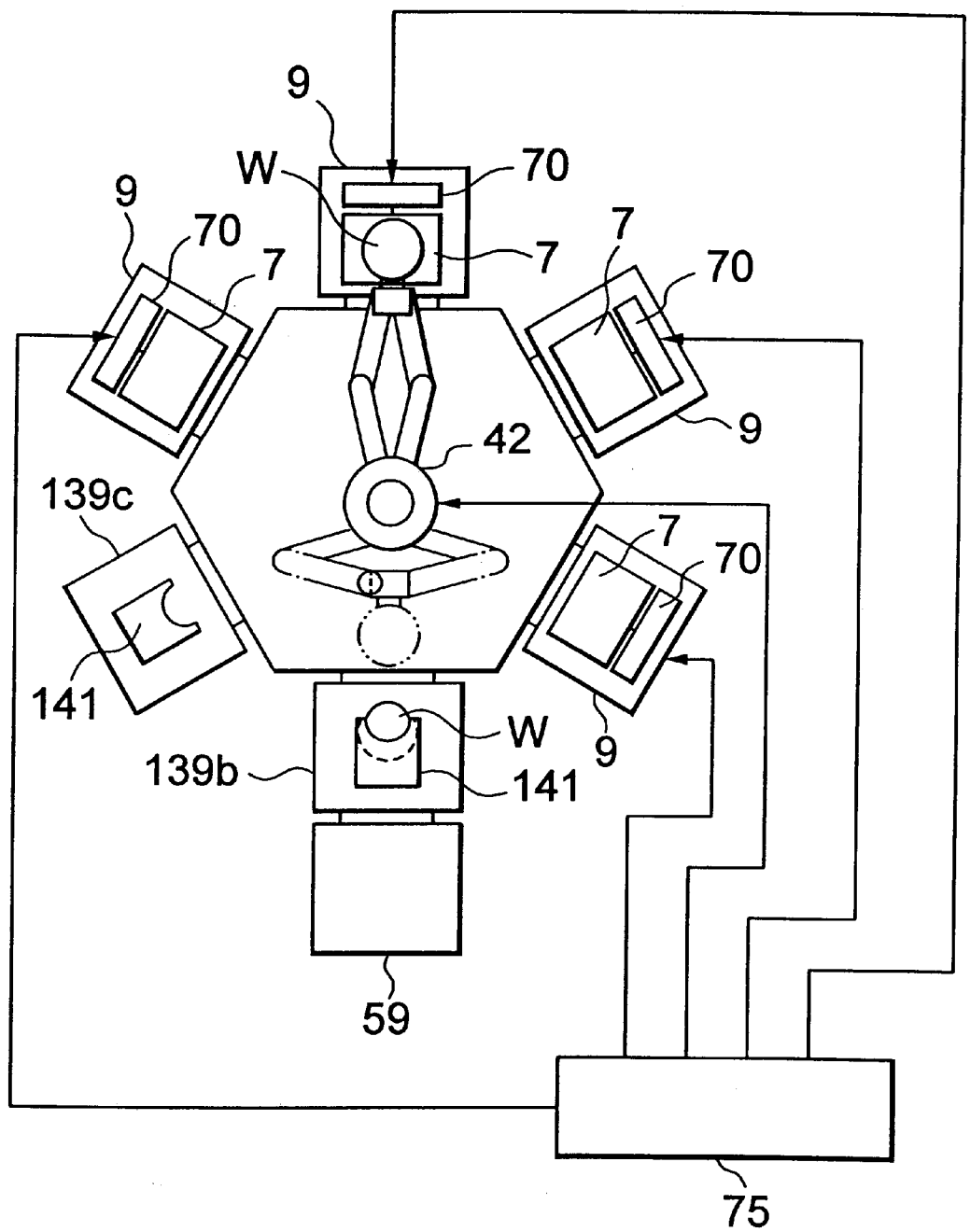
FIG. 21 is a block diagram of a wafer flattening system according to a fourth embodiment of the present invention.

FIG. 21 is a block diagram of a wafer flattening system according to a fourth embodiment of the present invention. Note that elements the same as elements shown in FIG. 17 are explained given the same reference numerals.

This wafer flattening system differs from the above third embodiment in that it can use a single etching apparatus to perform the natural oxide film removing processing, the local etching processing, and the smoothing processing and further in that it provides a plurality of such etching apparatuses and therefore can substantially simultaneously process a plurality of silicon wafers W.

As shown in FIG. 21, this wafer flattening system is comprised of a positioning mechanism 59 for positioning a silicon wafer W, a load chamber 139b in which a cassette 140 for storing unprocessed silicon wafers W is placed, an unload chamber 139c in which a cassette 141 for storing processed silicon wafers W is placed, four process chambers 9, a robot 42 serving as a loading device and unloading device, and a second automatic controller 75.

Figure 22:
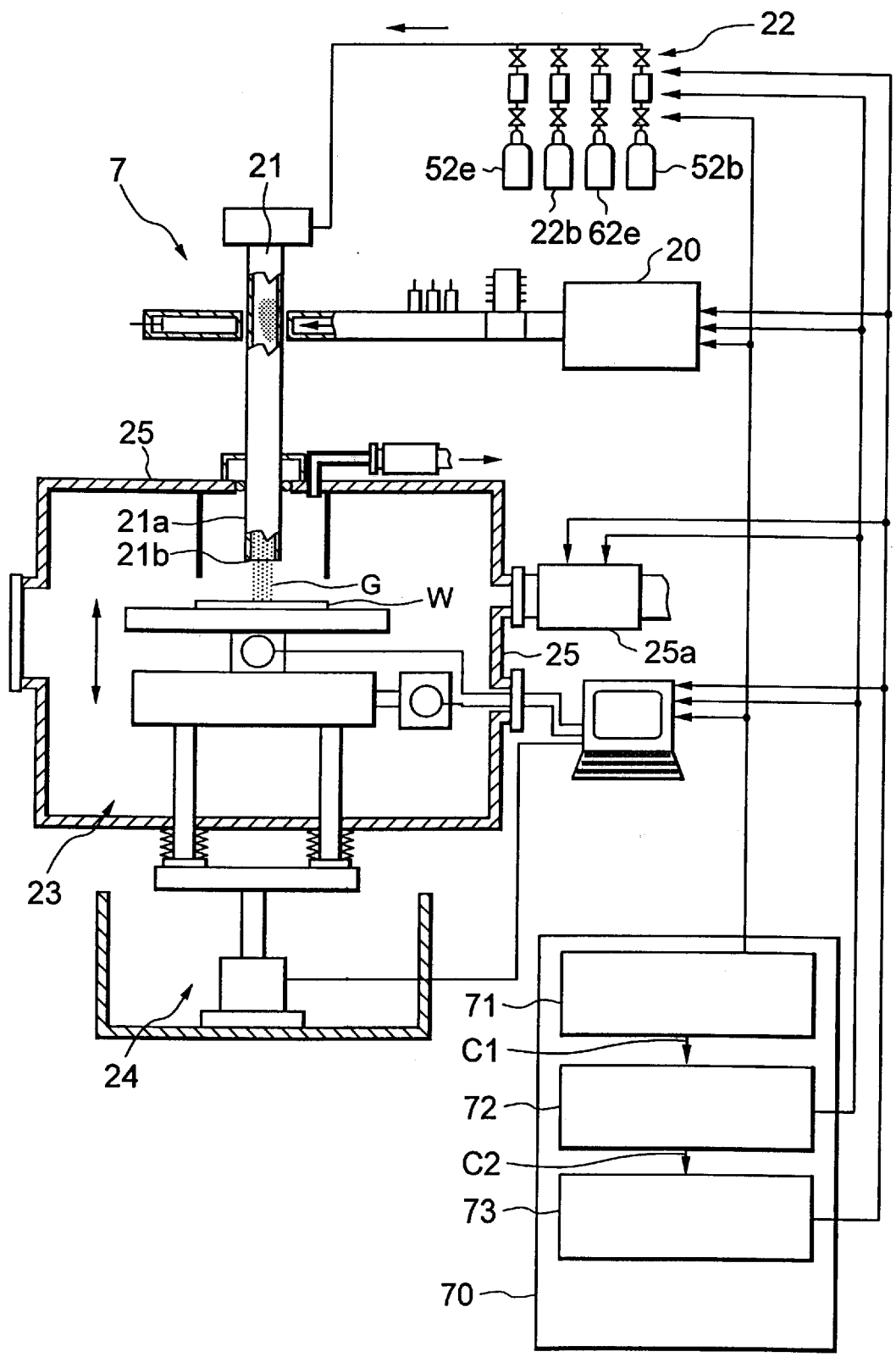
FIG. 22 is a sectional view of an etching apparatus in the plasma chamber and a first automatic control device and showing the state of local etching processing by the etching apparatus.

Each process chamber 9, as shown in FIG. 22, is provided with an etching apparatus 7 of substantially the same structure as the local etching apparatus shown in FIG. 3 and a first automatic controller 70.

Each etching apparatus 7 is connected to a gas feeder 22. This gas feeder 22 has an $SF_6$ gas cylinder 22b, a $CF_4$ gas cylinder 52b, an $H_2$ gas cylinder 52e, and an $O_2$ gas cylinder 62e.

On the other hand, the first automatic controller 70 is comprised of a natural oxide film removing processing controller 71, a local etching processing controller 72, and a smoothing processing controller 73.

Figure 23:
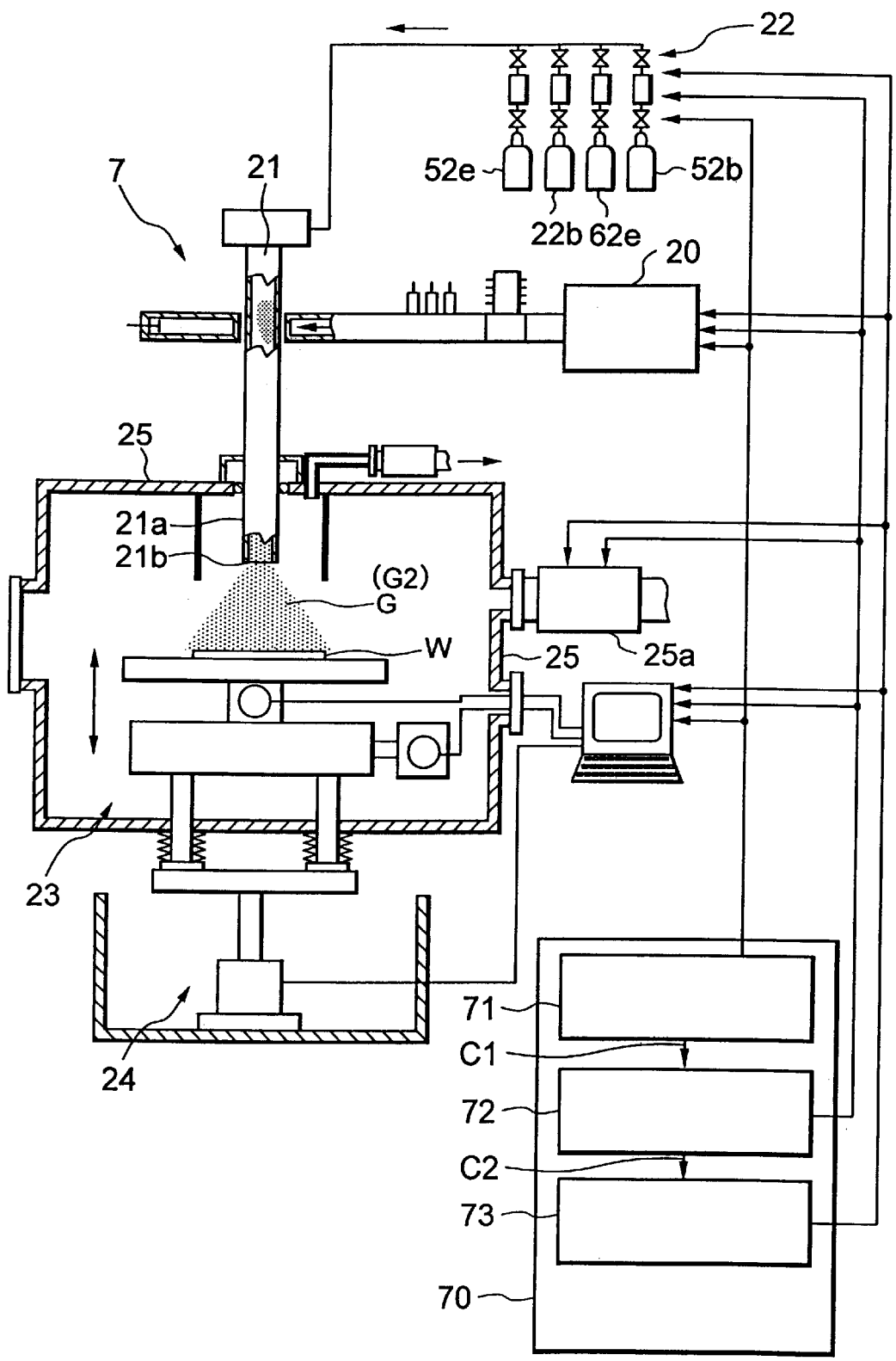
FIG. 23 is a sectional view of the state of processing for natural oxide film removal and the smoothing processing according to the etching apparatus.

The natural oxide film removing processing controller 71 is a portion for making an etching apparatus 7 automatically perform the natural oxide film removing processing. Specifically, the natural oxide film removing processing controller 71 has the function of driving a Z-drive mechanism 24 serving as the transfer mechanism so as to make the X-Y drive mechanism 23 as a whole descend and, as shown in FIG. 23, move the silicon wafer W away from the nozzle 21a of the alumina discharge tube 21. At this time, the distance between the opening 21b of the nozzle 21a and the silicon wafer W is sufficiently large and is the distance over which the activated species gas G2 sprayed from the nozzle 21a diffuses over the entire surface of the silicon wafer W. Further, the natural oxide film removing processing controller 71 controls the gas feeder 22 to open the gas cylinder 52b and gas cylinder 52e and feed a mixed gas of the $CF_4$ gas and $H_2$ gas to the alumina discharge tube 21 and drive the etching apparatus 7. That is, it drives the plasma generator 20 to cause plasma discharge of the mixed gas and cause the generated activated species gas G2 to diffuse over the entire surface of the silicon wafer W to remove the natural oxide film on the surface of the silicon wafer W. The natural oxide film removing processing controller 71 causes the activated species gas G2 to be sprayed for a predetermined time, then outputs a processing completion signal C1 to the local etching processing controller 72.

The local etching processing controller 72 is a portion for making an etching apparatus 7 automatically perform the local etching processing. Specifically, the local etching processing controller 72 has the function of, when receiving as input a processing completion signal C1 from the natural oxide film removing processing controller 71, driving the Z-drive mechanism 24 to make the X-Y-drive mechanism 23 as a whole rise and bring the silicon wafer W close to the nozzle 21a as shown in FIG. 22. At this time, the distance between the opening 21b of the nozzle 21a and the silicon wafer W is sufficiently small and is the distance by which the activated species gas G sprayed from the nozzle 21a locally strikes a relatively thick portion of the silicon wafer W. Further, the local etching processing controller 72 drives the vacuum pump 25a to exhaust the gas in the chamber 25, then controls the gas feeder 22 to open the gas cylinder 22b and feed $SF_6$ gas to the alumina discharge tube 21 and drives the etching apparatus 7. That is, it drives the plasma generator 20 to locally spray the surface of the silicon wafer W with the activated species gas G produced while making the silicon wafer W move by the X-Y drive mechanism 23 so that the relatively thick portions are successively locally etched. The local etching processing controller 72 makes the etching apparatus 7 perform this processing for a predetermined time, then outputs a processing completion signal C2 to the smoothing processing controller 73.

The smoothing processing controller 73 is a portion for making the etching apparatus 7 automatically perform the smoothing processing. Specifically, the smoothing processing controller 73 has the function of, when receiving as input the processing completion signal C2 from the local etching processing controller 72, driving the Z-drive mechanism 24 to make the X-Y drive mechanism 23 as a whole descend again and, as shown in FIG. 23, bring the silicon wafer W away from the nozzle 21a and making the silicon wafer W rotate by the X-Y drive mechanism 23. Further, the smoothing processing controller 73 drives the vacuum pump 25a to exhaust the gas in the chamber 25, then controls the gas feeder 22 to open the gas cylinder 52b and the gas cylinder 62e to feed a mixed gas of $CF_4$ gas and $O_2$ gas to the alumina discharge tube 21 and drives the etching apparatus 7. That is, it drives the plasma generator 20 to make the activated species gas G2 produced diffuse over the entire surface of the silicon wafer W so as to smooth the entire surface of the silicon wafer W. The smoothing processing controller 73 makes the etching apparatus 7 perform the processing for spraying the activated species gas G2 for a predetermined time, then stops driving the etching apparatus 7.

In FIG. 21, the second automatic controller 75 is an apparatus for controlling the robot 42 to load a silicon wafer W to the etching apparatus 7 in the process chamber 9 and unload the silicon wafer W from the etching apparatus 7 after the elapse of a predetermined time.

Specifically, the second automatic controller 75 controls the robot 42 to successively load four unprocessed silicon wafers W stored in the cassette 140 in the load chamber 139b to the etching apparatuses 7 in the four process chambers 9, then drives the first automatic controllers 70 in the process chambers 9. Further, the second automatic controller 75 has the function of, after the elapse of a time more than the total time for the natural oxide film removing processing, the local etching processing, and the smoothing processing in the etching apparatus 7, making the first automatic controllers 70 stop and controlling the robot 42 to unload the processed silicon wafers W from the four etching apparatuses 7 and store them in the cassette 141 in the unload chamber 139c.

By adopting this configuration for the wafer flattening system of this embodiment, it is possible to substantially simultaneously process four silicon wafers W. That is, in the third embodiment, when the natural oxide film removing device 5 broke down or slowed in processing, the processing of the system as a whole could stop or slow, but in the wafer flattening system of this embodiment, it is possible to process by the other three etching apparatuses 7 even when one etching apparatus 7 breaks down or is slowed in processing.

The rest of the configuration and the mode of operation and advantageous effects are similar to those of the third embodiment explained above, so explanations thereof will be omitted.

Note that the present invention is not limited to the above embodiments and may be modified or changed in various ways within the scope of the gist of the invention.

For example, in the above embodiments, $SF_6$ gas or $CF_4$ gas was used as the fluorine compound, but it is also possible to use $NF_3$ gas (nitrogen trifluoride) gas. Further, the system was designed to feed just $SF_6$ gas to the alumina discharge tube 21 of the local etching apparatus 2, but it is also possible to design it to feed a mixture of $SF_6$ gas with $O_2$ gas and other gases to the alumina discharge tube 21.

Further, in the above embodiments, plasma generators 20, 50, and 60 for generating plasma by generating a microwave were used as plasma generators, but it is sufficient that it be a means which can generate an activated species gas. It is of course possible to use various other types of plasma generators such as plasma generators which produce activated species gas by generating a plasma by high frequency.

Figure 24:
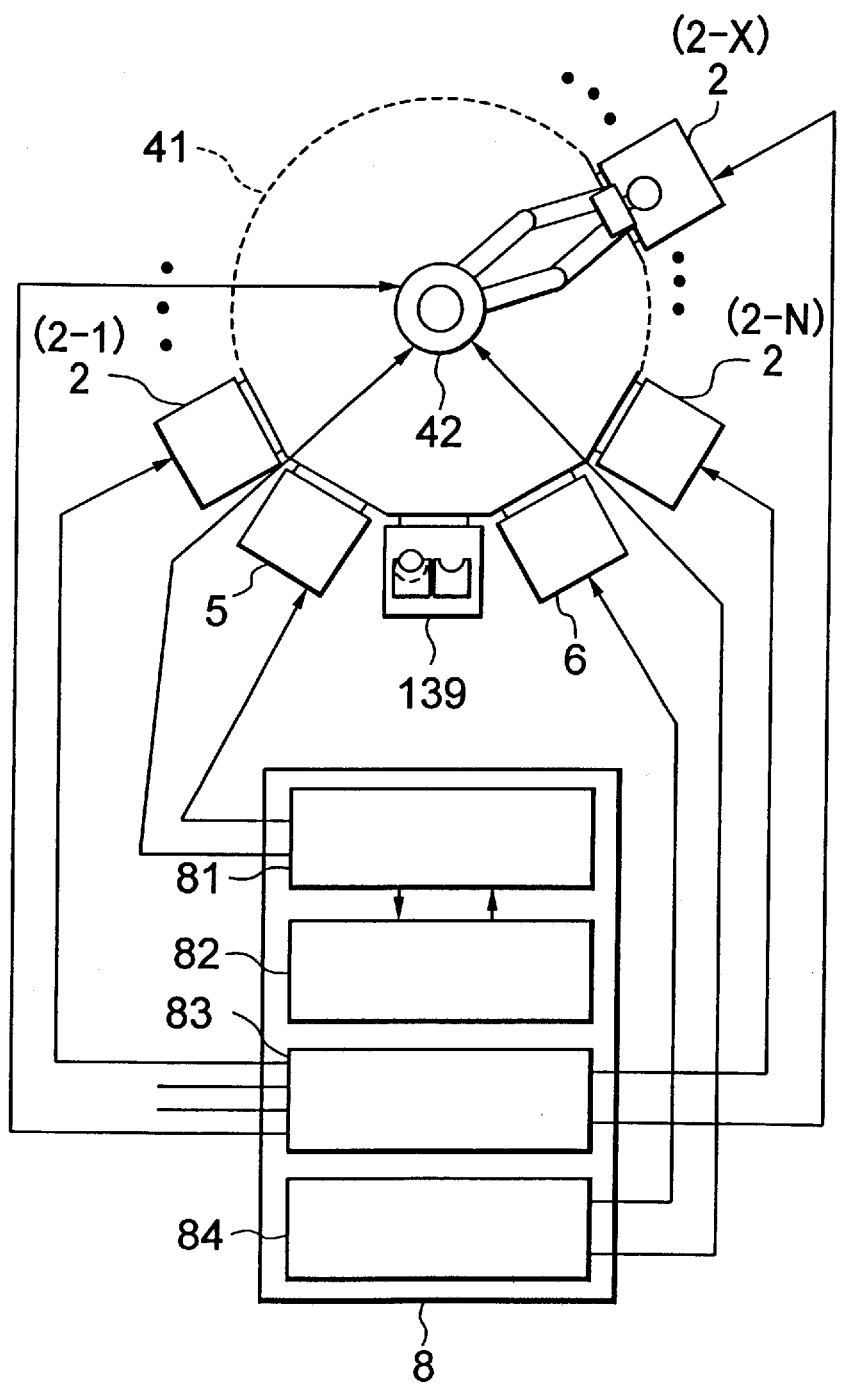
FIG. 24 is a sectional view of a modification of the wafer flattening system.
Figure 25:
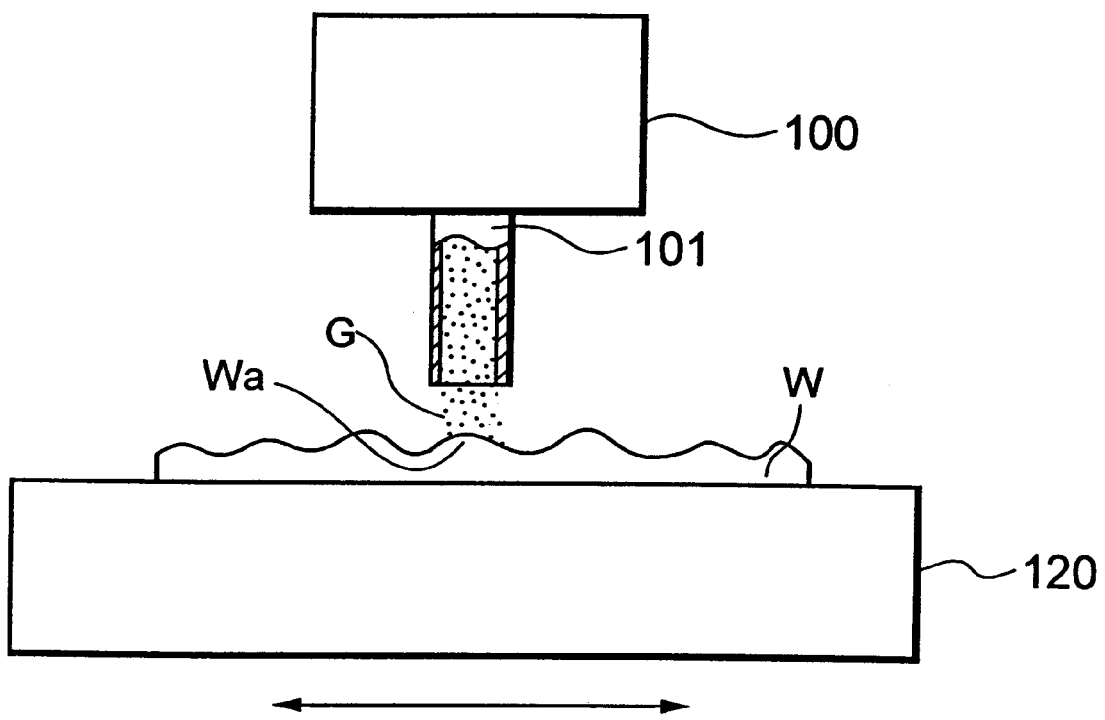
FIG. 25 is a schematic sectional view of an example of a wafer flattening technique of the related art.

Further, the wafer flattening system of the third embodiment was designed with three local etching apparatuses 2 provided, but as shown in FIG. 24, it is possible to design it with any number of local etching apparatuses 2.

Here, consideration will be given to the processing time etc. when providing N number of local etching apparatuses 2.

Consider the time spent, that is, the total processing time, when processing Y number of silicon wafers W by the wafer flattening system shown in FIG. 24 where the time enabling natural oxide film removal by the natural oxide film removing device 5 is T, the time enabling local etching processing by one local etching apparatus 2 is m×T, and the time enabling smoothing by the smoothing apparatus 6 is t.

When N<m, simple calculation gives the following equations (1) and (2):

$$P1 = mx[Y/N] + (a-1) + T + t \qquad (1)$$

$$a = Y - ([Y/N] - 1)xN \qquad (2)$$

where, P1 is the total processing time. Further, [Y/N] indicates the smallest whole number in the whole numbers of (Y/N) or more. For example, [2.4] is "3" and [3] is "3".

From the above equations (1) and (2), the total processing time P1 when N<m can be represented by the following equation (3):

$$P1 = (m-N)x[Y/N] + Y + N - 1 + T + t \qquad (3)$$

Further, the total processing time P2 when N=m can be represented by the following equation (4):

$$P2 = Y + N - 1 + T + t \qquad (4)$$

Further, the total processing time P3 when N>m can be represented by the following equation (5):

$$P3 = P1 + (N-m)x([Y/N]-1) \therefore = Y + m - 1 + T + t \qquad (5)$$

Note that the total processing time P0 when there is only one local etching apparatus 2 is represented by the following equation (6):

$$P0 = mY + T + t \tag{6}$$

Next, consider the relation of magnitude among the total processing times P0, P1, P2, and P3 shown by the above equations (3) to (6).

First, the difference between P0 and P1 is represented by the following equation (7):

$$P0 - P1 = mY + T + t - \{(m-N)x[Y/N] + Y + N - 1 + T + t\} \tag{7}$$

Here, even if [Y/N]=(Y/N), it is considered that there is no effect on the determination of the sign of equation (7), so if [Y/N]=(Y/N), the following equation (8) is obtained from the above equation (7):

$$P0 - P1 = \{(mY/N) - 1\}(N-1) \tag{8}$$

Since N<m and N>1, P0−P1>0 and as a result the following relation (9) is obtained:

$$P0 > P1 \tag{9}$$

The difference between P1 and P2 is expressed by the following equation (10):

$$P1 - P2 = (m-N)x(Y/N) \tag{10}$$

Here, the following relation (11) is obtained since N<m:

$$P1 > P2 \tag{11}$$

Finally, the difference between P3 and P2 is expressed by the following equation (12):

$$P2 - P3 = N - m \tag{12}$$

Here, the following relation (13) is obtained since N>m:

$$P2 > P3 \tag{13}$$

From the above relations (9), (11), and (13), the following relation (14) is obtained:

$$P0 > P1 > P2 > P3 \tag{14}$$

From the results of the relation (14), it is learned that the total processing time P3 is the shortest. Therefore, by setting N>m in a wafer flattening system provided with N number of local etching apparatuses 2 where the time mT enabling local etching processing is m-times the time T enabling natural oxide film removal, it is possible to further improve the throughput.

As explained in detail above, according to the present invention, since the natural oxide film of the wafer surface is removed before the local etching, it is possible to prevent the generation of white turbidity during local etching. Further, since the wafer surface is flattened by local etching before smoothing the entire surface of the wafer, it is possible to reduce the surface roughness of the wafer and as a result possible to provide a high quality wafer. Further, since the removal of the natural oxide film from the wafer surface and the flattening and smoothing are performed consecutively and automatically, it is possible to improve the work efficiency and the throughput.

Further, since the system is designed to perform a plurality of local etching processings on a plurality of wafers, it is possible to process a large number of wafers in a short time and as a result possible to further improve the throughput.

What is claimed is:

1. A wafer flattening system comprising:

a natural oxide film removing device for removing a natural oxide film formed on a wafer surface;

a first transport device for taking out a wafer from which the natural oxide film has been removed by said natural oxide film removing device and transporting it to a predetermined location;

a local etching apparatus provided with a discharge tube with a nozzle facing the wafer transported by said first transport device and a plasma generator for causing plasma generation of a gas of a fluorine compound or a mixed gas including a fluorine compound fed to said discharge tube so as to produce a predetermined activated species gas and spraying the activated species gas from the nozzle of said discharge tube to a relatively thick portion of the surface of the wafer to locally etch the relatively thick portion;

a second transport device for taking out a wafer flattened by said local etching apparatus and transporting it to a predetermined location; and a smoothing apparatus for grinding off a projection on the surface of the wafer transported by said second transport device to smooth the wafer surface.

2. A wafer flattening system as set forth in claim 1, wherein said first transport device and said second transport device are configured by a single transport device used for both purposes.

3. A wafer flattening system as set forth in claim 1, wherein said natural oxide film removing device is provided with a solution tank for storing a solution for removal of the natural oxide film of the wafer, a washer, and a third transport device for immersing the wafer in said solution tank and then transporting it to said washer.

4. A wafer flattening system as set forth in claim 3, wherein the solution for removal of the natural oxide film stored in said solution tank is an aqueous solution of hydrofluoric acid.

5. A wafer flattening system as set forth in claim 1, wherein said natural oxide film removing device is provided with a discharge tube for spraying a predetermined activated species gas over the entire surface of the wafer and a plasma generator for causing plasma discharge of a mixed gas including a fluorine compound and hydrogen in said discharge tube so as to produce the activated species gas.

6. A wafer flattening system as set forth in claim 5, wherein the ratio of the hydrogen to the flourine compound in the mixed gas is from 0.1% to 50% by volume.

7. A wafer flattening system as set forth in claim 5, wherein said natural oxide film removing device is provided with a positioning mechanism for positioning a flat or notch of the wafer.

8. A wafer flattening system as set forth in claim 5, wherein said smoothing apparatus is a chemical mechanical polishing apparatus provided with a platen having a polishing pad on its surface and capable of rotating, a carrier for holding the surface of the wafer in a state facing said platen and rotating while pressing the wafer against said polishing pad of said platen, and a polishing slurry feeder for feeding a predetermined polishing slurry between the wafer surface and said polishing pad.

9. A wafer flattening system as set forth in claim 1, wherein said smoothing apparatus is provided with a discharge tube for spraying a predetermined activated species gas over the entire surface of the wafer and a plasma generator for causing plasma discharge of a mixed gas of a fluorine compound and oxygen in said discharge tube to produce the activated species gas.

10. A wafer flattening system as set forth in claim 9, wherein the fluorine compound in the mixed gas is selected from the group consisting of carbon tetrafluoride, sulfur hexafluoride, and nitrogen trifluoride.

11. A wafer flattening system as set forth in claim 10, wherein the ratio of the oxygen to the carbon tetrafluoride in the mixed gas is 200% to 400% by volume.

12. A wafer flattening system as set forth in claim 5, further comprising:

N (an integer of 2 or more) number of local etching apparatuses; and a controlling apparatus provided with a natural oxide film removing device controller for controlling said first transport device to load an unprocessed wafer to the not operating natural oxide film removing device, making said natural oxide film removing device operate for exactly a time enabling natural oxide film removal, then controlling said first transport device to transport the wafer finished being removed of the natural oxide film from said natural oxide film removing device to a not operating X-th (integer from 2 to N) local etching apparatus, a local etching apparatus controller for making the X-th local etching apparatus operate for exactly a time enabling local etching, then controlling said second transport device to transport the wafer finished being locally etched from said local etching apparatus to the not operating smoothing apparatus, and a smoothing apparatus controller for making said smoothing apparatus operate for exactly a time enabling smoothing, then controlling said second transport device to unload the wafer finished being smoothed from said smoothing apparatus.

13. A wafer flattening system as set forth in claim 12, wherein a transport sequence controller for controlling said natural oxide film removing device controller is provided at said controlling apparatus so that said first transport device transports a wafer finished being removed of its natural oxide film to said local etching apparatus with the longest non-operating time among said local etching apparatuses finishing local etching processing.

14. A wafer flattening system as set forth in claim 12, wherein N>m is set when the time enabling local etching in said local etching apparatus is m (positive integer) times the time enabling natural oxide film removal in said natural oxide film removing device.

15. A wafer flattening system comprising:

an etching apparatus provided with a discharge tube with a nozzle facing a surface of a wafer and a plasma generator for causing plasma generation of a predetermined gas fed to said discharge tube so as to produce a predetermined activated species gas and spraying the activated species gas from the nozzle of said discharge tube to the surface of the wafer to etch the wafer surface;

a gas feeder capable of feeding the gas into said discharge tube;

a transfer mechanism for shortening or increasing the distance between the nozzle of said discharge tube and the wafer; and a first automatic controller provided with a natural oxide film removing processing controller for controlling said transfer mechanism to increase the distance between the nozzle and the wafer until the activated species gas sprayed from the nozzle will diffuse over the entire surface of the wafer and controlling said gas feeder to feed a mixed gas containing a fluorine compound and hydrogen to the inside of said discharge tube, then driving said etching apparatus, a local etching processing controller for controlling said transfer mechanism to shorten the distance between the nozzle and the wafer until the activated species gas sprayed from the nozzle will locally strike a relatively thick portion of the wafer and controlling said gas feeder to make it feed a gas of a fluorine compound or a mixed gas including a fluorine compound into said discharge tube, then driving said etching apparatus, and a smoothing processing controller for controlling said transfer mechanism to increase the distance between the nozzle and the wafer until the activated species gas sprayed from the nozzle will diffuse over the entire surface of the wafer and controlling said gas feeder to make it feed a mixed gas containing a fluorine compound and oxygen to the inside of said discharge tube, then driving said etching apparatus.

16. A wafer flattening system as set forth in claim 15, further comprising:

N (an integer of 2 or more) number of etching apparatuses;

a loader for loading a wafer into said etching apparatus;

an unloader for unloading a wafer from said etching apparatus; and a second controller for driving said loader to make it load N number of unprocessed wafers inside the N number of etching apparatuses, then driving said first automatic controller and then, after the elapse of a predetermined time, driving said unloader to unload the N number of processed wafers from the N number of etching apparatuses.

\* \* \* \* \*